United States Patent
Deguchi et al.

(12) 
(10) Patent No.: US 6,489,614 B1
(45) Date of Patent: Dec. 3, 2002

(54) THERMAL-TYPE INFRARED RADIATION DETECTOR CELL AND IMAGE CAPTURE DEVICE INCORPORATING THE SAME

(75) Inventors: Haruhiko Deguchi, Tenri (JP); Toshihiko Fukushima, Nara (JP); Tomohisa Komoda, Naga-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 70 days.

(21) Appl. No.: 09/662,631

(22) Filed: Sep. 15, 2000

(30) Foreign Application Priority Data

Sep. 16, 1999 (JP) .......................... 11-262400
Oct. 19, 1999 (JP) .......................... 11-296745
Aug. 30, 2000 (JP) ...................... 2000-261655

(51) Int. Cl.$^7$ ................................ G01J 5/00
(52) U.S. Cl. .................... 250/338.1; 250/332
(58) Field of Search .................. 250/338.1, 338.4, 250/332

(56) References Cited

U.S. PATENT DOCUMENTS

| | | | | |
|---|---|---|---|---|
| 4,148,050 A | | 4/1979 | Maier, Jr. ................... | 257/436 |
| 4,806,763 A | | 2/1989 | Turnbull ................... | 250/338.4 |
| 5,015,353 A | * | 5/1991 | Hubler et al. ............... | 427/527 |
| 5,288,649 A | * | 2/1994 | Keenan ..................... | 250/338.4 |
| 5,369,280 A | * | 11/1994 | Liddiard .................... | 250/338.4 |
| 5,912,464 A | | 6/1999 | Vilain et al. .............. | 250/338.4 |

FOREIGN PATENT DOCUMENTS

| | | |
|---|---|---|
| EP | 0534768 A1 | 3/1993 |
| JP | 6120569 | 4/1994 |
| JP | 10111178 | 4/1998 |
| JP | 11289492 | 10/1999 |
| WO | 9116607 | 10/1991 |

* cited by examiner

*Primary Examiner*—Constantine Hannaher
*Assistant Examiner*—Shun Lee
(74) *Attorney, Agent, or Firm*—Birch, Stewart, Kolasch & Birch, LLP.

(57) ABSTRACT

A thermal-type infrared radiation detector cell includes a diaphragm structural body that forms a gap of a predetermined width over a semiconductor substrate. The diaphragm structural body is capable of either providing metal wiring films that doubles as an infrared radiation reflector film or providing a high refractive index film having a thickness set to satisfy the expression $d=\lambda \times \{1/(4 \times n)\}$, where n is the refractive index of the high refractive index film, and $\lambda$ is the wavelengths of infrared rays. As a result, in the former option, no separate infrared radiation reflector film is required, whilst in the latter no separate infrared radiation absorption layer is required. This facilitates the manufacturing process and improves the sensitivity in infrared radiation detection.

26 Claims, 17 Drawing Sheets

THERMAL-TYPE INFRARED RADIATION DETECTOR CELL AND IMAGE CAPTURE DEVICE INCORPORATING THE SAME

FIELD OF THE INVENTION

The present invention relates to infrared radiation detector cells for detecting infrared radiation, in particular, to thermal-type infrared radiation detector cells for detecting infrared radiation by converting it to heat, and further relates to image capture devices incorporating such thermal-type infrared radiation detector cells. Specifically, the present invention relates to thermal-type infrared radiation detector cells with an increased infrared radiation absorption rate and reduced irregularities in detection sensitivity, and further relates to image capture devices incorporating such thermal-type infrared radiation detector cells.

BACKGROUND OF THE INVENTION

Conventionally, there are a large variety of infrared radiation detection methods being developed based on different principles and adopted in the working of various types of infrared radiation detector cells for detecting infrared radiation. Typically used among these methods is to convert infrared radiation energy into electrical signals by means of a band gap of semiconductor materials, i.e., to exploit photon effects of infrared radiation energy, because the method exhibits high sensitivity and quick response. Infrared radiation detector cells incorporating the method is called a quantum type.

Despite these advantages, the quantum-type infrared radiation detector cell is only capable of detecting a limited range of wavelengths. To detect those infrared rays with very low infrared radiation energy, e.g., those with long wavelengths, semiconductor materials used for the detection of infrared radiation need to be kept at an extremely low temperature. For example, in the quantum-type infrared radiation detector cell, the semiconductor material needs to be kept around 77K, that is, approximately −196° C., using liquid nitrogen. This requirement makes infrared radiation detector devices cumbersome to handle and difficult to make smaller due to the use of liquid nitrogen for cooling.

Another type of infrared radiation detector cells developed based on different principles to detect infrared radiation is of thermal types that do so by converting infrared radiation energy into heat. In a thermal-type infrared radiation detector cell, as a detector cell material absorbs infrared radiation energy and converts it to heat, the detector cell material heats up and thus changes its physical properties (electrical resistance, pyroelectricity, etc.). By means of the detection of these changes, the infrared radiation is detected.

Accordingly, in the thermal-type infrared radiation detector cell, unlike in its quantum-type counterpart, there is no need for semiconductor materials used for the detection of infrared radiation to be kept at extremely low temperatures. Thus, the thermal-type infrared radiation detector cell can be used at room temperature and offers room for possible reduction in size through the omission of cooling means, thereby getting wide attention for its practical performance in recent years.

However, some objects generate so little heat in the thermal-type infrared radiation detector cell that the resultant temperature elevation is as small as 0.01° C. or even smaller, making it difficult for the thermal-type infrared radiation detector cell to detect infrared radiation. To solve this problem, some thermal-type infrared radiation detector cells incorporate such a structure that exhibits an increased infrared radiation absorption rate, and thus increase the elevation in their temperature and enhance the sensitivity in detecting infrared radiation to a greatest extent possible.

To solve these problems, the typical thermal-type infrared radiation detector cell typically including a diaphragm structure in which a diaphragm structural body for detecting infrared radiation is separated by a predetermined gap from a semiconductor substrate on which there is provided an integrated circuit (or a signal integrated circuit) electrically connected to the diaphragm structural body by metal wiring. The structure enhances the thermal insulation between the diaphragm structural body (infrared radiation receiving section, or sensor section) for detecting infrared radiation and the semiconductor substrate with an integrated circuit, thereby successfully achieving high sensitivity in the detection of infrared radiation.

To further improve on the infrared radiation absorption rate, the thermal-type infrared radiation detector cell incorporating the diaphragm structure normally employs one of two techniques: namely, (a) the selective use of substance exhibiting high infrared radiation absorption, and (2) the adoption of multiple reflection of infrared rays. According to technique (1), arrangement (a) is employed whereby a thin film (infrared radiation absorbing film) composed of a material exhibiting a high infrared radiation absorption rate is provided on the surface of the diaphragm structure. According to technique (2), arrangement (b) is employed whereby, in addition to arrangement (a), an infrared radiation reflector film is provided on the semiconductor substrate below the diaphragm structure.

FIGS. 15(a) and 15(b) show an example of arrangement. (a) adopted in a thermal-type infrared radiation detector cell incorporating technique (1). A diaphragm structural body 101a is positioned over a semiconductor substrate 108 on top of which there is provided an integrated circuit (not shown), so as to be separated from the semiconductor substrate 108 by a predetermined gap. An infrared radiation absorbing film 107a is also provided on the surface of the diaphragm structural body 101a (arrangement (a)).

FIGS. 16(a) and 16(b) show an example of arrangement (b) adopted in a thermal-type infrared radiation detector cell incorporating technique (2). Arrangement (b) is basically identical to arrangement (a) employed in the thermal-type infrared radiation detector cell shown in FIGS. 15(a) and 15(b), except that arrangement (b) additionally includes an infrared radiation reflector film 106 on the surface of the semiconductor substrate 108.

The arrangements employed in the thermal-type infrared radiation detector cell will be briefly discussed below. The diaphragm structural body 101a or 101b are each constituted by a second silicon oxide film 102, a thermally variable resistor film 103 and a metal wiring film 104 provided on the second silicon oxide film 102 in a predetermined pattern, and a third silicon oxide film 105 covering these films. Infrared radiation absorbing films 107a and 107b composed of a material processing a high infrared radiation absorption rate are provided on the third silicon oxide film 105 according to techniques (1) and (2) respectively (arrangement (a)).

A first silicon oxide film 109 is provided on the semiconductor substrate 108 on top of which there is provided an integrated circuit (not shown). According to technique (2), an infrared radiation reflector film 106 composed of a substance capable of substantially entirely reflecting infrared rays is provided on the first silicon oxide film 109 so as to oppositely face the diaphragm structural body 101b (arrangement (b)).

It should be noted that as shown in FIG. 15 (a) and FIG. 16(a), both diaphragm structural bodies 101a and 101b are supported by legs 110 and electrically connected to the semiconductor substrate 108 via the metal wiring film 104 contained in the legs 110. As shown in FIG. 15(a) and FIG. 16(a), almost all of the surfaces of the diaphragm structural bodies 101a and 101b serve as first infrared radiation receiving areas (enclosed by broken lines).

In the thermal-type infrared radiation detector cells including arrangement (a) and (b), incident infrared rays shine down on the infrared radiation absorbing films 107a and 107b in the first infrared radiation receiving areas of the diaphragm structural bodies 101a and 101b respectively. Under these conditions, in technique (1), infrared rays are substantially entirely absorbed by the infrared radiation absorbing film 107a of a sufficiently increased thickness.

In technique (2), the infrared rays are partly reflected by, and partly pass through, the infrared radiation absorbing film 107b, with the rest of the infrared rays being converted to Joule heat by the electrical resistance of, and subsequently absorbed by, the infrared radiation absorbing film 107b. Having passed through the infrared radiation absorbing film 107b, the infrared rays pass through the diaphragm structural body 101b, that is, through the third silicon oxide film 105, the thermally variable resistor film 103, and the second silicon oxide film 102, and reach the infrared radiation reflector film 106.

The infrared rays are then entirely reflected back toward the diaphragm structural body 101b from the infrared radiation reflector film 106 with a phase delay of π, because the infrared radiation reflector film 106 is a low-resistance complete reflection film composed with a metal with a sheet resistance not exceeding a few $\Omega/\square$. The reflected infrared rays take the path in reverse direction, passing through the diaphragm structural body 101b. As having reached the infrared radiation absorbing film 107b disposed on the top of the diaphragm structural body 101b, the infrared rays are again reflected, passed, and absorbed by the infrared radiation absorbing film 107b.

As detailed above, the incident infrared rays entering the diaphragm structural body 101b are repeatedly reflected in the diaphragm structural body 101b and do not leak out, effectively improving the infrared radiation absorption rate of the thermal-type infrared radiation detector cell. In a thermal-type infrared radiation detector cell incorporating the diaphragm structural body 101b, that is, employing technique (2), the infrared radiation absorption rate per unit area is determined by the relationships among the reflection, passage, and absorption of infrared rays in the diaphragm structural body 101b.

A specific example of technique (2) is disclosed in Japanese Laid-Open Patent Application No. 10-111178/1998. In this example, the infrared radiation absorbing film is separated from a reflector film by a predetermined distance by means of the interposition of one or more intermediate films of a predetermined thickens between the infrared radiation absorbing film and the reflector film underneath. In this example the predetermined distance, d, is defined as follows:

$$d=(2N-1)\times\lambda/(4n)$$

wherein N is a positive integer, λ is the wavelengths of infrared rays detected, and n is the refractive index of the film with a predetermined thickness.

The arrangement enables the distance by which the reflector film is separated from the infrared radiation absorbing film to be maintained at a fixed value, and improves sensitivity by reducing the thickness of the diaphragm structural body 101b, since an increase in the refractive index of the intermediate film allows a reduction in the predetermined distance.

However, generally, a structure with high infrared radiation absorption and a manufacturing process to incorporate such a structure in the thermal-type infrared radiation detector cell are so complex to reduce the yields and increase cost. Both techniques (1) and (2) suffer these problems.

In addition to these problems, thermal-type infrared radiation detector cells fabricated by technique (1) entail slow response due to its enlarged size and hence increased thermal capacity. As a result, an infrared radiation image capture device incorporating such a thermal-type infrared radiation detector cell fails to produce a satisfactory level of performance.

Specifically, according to technique (1), the infrared radiation absorbing film 107a including arrangement (a) should be composed of material capable of absorbing infrared radiation efficiently, such as gold black and organic materials; however, it is difficult to fabricate a thin film from the material. Contradictory to the requirement to reduce the film thickness made of the material, the infrared radiation absorbing film 107a needs to have a thickness of at least a few μm to exhibit an infrared radiation absorption rate of 80% or greater. The thickness imparts too large thermal capacity for the infrared radiation detector cell to produce quick response, which presents an obstacle in high speed imaging. For these reasons, the thermal-type infrared radiation detector cell incorporating technique (1) is rarely applied in infrared radiation image capture elements.

According to technique (2), the diaphragm structural body 101b including arrangement (b) produces internal multiple reflection and thereby does not allow infrared rays to leak out. This allows the infrared radiation absorbing film 107b incorporating arrangement (a) to have a reduced thickness as small as a few hundred nm and hence to have a reduced thermal capacity. Further, theoretically, the infrared radiation absorption rate reaches almost 100% if the distance by which the diaphragm structural body 101b incorporating arrangement (a) is separated from the semiconductor substrate 108 incorporating arrangement (b) is equal to ¼n times the wavelength of the infrared rays absorbed, and the sheet resistance of the infrared radiation absorbing film 107b incorporating arrangement (a) is equal to 377 Ω.

However, technique (2) entails three major structural problems caused by (i) the metal wiring film 104, (ii) the infrared radiation reflector film 106, and (iii) the control of the distance between the infrared radiation absorbing film 107b and the infrared radiation reflector film 106. These problems are discussed in detail in the following.

(i) Problems Arising from the Metal Wiring Film 104

As shown in FIG. 16(a), in the thermal-type infrared radiation detector cell, a metal wiring film 104 is formed along each side of the thermally variable resistor film 103 to measure the resistance of the thermally variable resistor film 103. The metal wiring film 104 is typically composed of aluminum, and thus cause undesired reflection of infrared rays.

In other words, the diaphragm structural body 101b is designed so that the infrared radiation reflector film 106 reflects infrared rays in such a manner that the infrared rays are ultimately absorbed. Meanwhile, the metal wiring film 104 reflects infrared rays in such a manner that none of the infrared rays are absorbed. So, the parts of the thermally variable resistor film 103 covered with the metal wiring films 104 absorb almost no infrared rays.

The net infrared radiation absorption by the thermal-type infrared radiation detector cell is determined by the infrared radiation absorption rate in the infrared radiation receiving area I multiplied by the infrared radiation absorption area ratio. The infrared radiation absorption area ratio is defined as the ratio (fill factor) of the infrared radiation receiving area I to the size (cell size) of the thermal-type infrared radiation detector cell. For example, the thermal-type infrared radiation detector cell shown in FIG. 16(a) has a fill factor of about 0.5, and the infrared radiation absorption rate in the infrared radiation receiving area I is 80%. Accordingly, the net infrared radiation absorption by the thermal-type infrared radiation detector cell is given by:

80%×0.5=40%

The figure indicates that about 40% of incident infrared rays is absorbed.

ii) Problems Caused by the Infrared Radiation Reflector Film 106

The infrared radiation reflector film (low-resistance complete reflection film) 106 capable of reflecting the infrared rays having passed through the diaphragm structural body 101b is formed on a top surface of a first silicon oxide film 109, serving as a protection film, formed on the semiconductor substrate 108 on which there is provided an integrated circuit. Therefore, a separate step is necessary to fabricate the infrared radiation reflector film 106, which adds to the time required for the whole manufacturing process. Besides, the step to form the infrared radiation reflector film 106 must include alignment and etching, which adds to the total cost.

(iii) Problems in the Control of the Distance Between the Infrared Radiation Absorbing Film 107b and the Infrared Radiation Reflector Film 106

According to the principles based on which the infrared radiation absorbing film 107b absorb infrared rays, the infrared radiation absorption rate is influenced by the distance between the infrared radiation absorbing film 107b (arrangement (a)) and the infrared radiation reflector film 106 (arrangement (b)). Thus, the control of the distance between these thin films is essential. However, the stress of the thin films are extremely difficult to control, compared to the thicknesses of the thin films. Therefore, the thicknesses can be successfully controlled to form desirably thin films, whereas the control of the stress is likely to fail. This causes warping of the diaphragm structural body 101b and hence irregular distance. The resultant, actual infrared radiation absorption rate is thus inferior to that originally designed. For example, a thermal-type infrared radiation detector cell designed to absorb infrared rays of wavelengths in a range from 8 μm to 12 μm is. theoretically capable of achieving a 100% infrared radiation absorption rate, but in practical use exhibits only an unimpressive rate of about 80%.

Besides, the distance becomes irregular at any given point in a chip matrix. Therefore, when applied in an infrared radiation image capture element, the thermal-type infrared radiation detector cells incorporating technique (2) entail another problem of irregularities in in-plane angles, which negatively affects image quality.

A further problem is found in Tokukaihei 10-111178 which is an example of technique (2). According to the disclosure, the infrared radiation absorbing film is separated from the reflector film by a predetermined distance, d, by means of the interposition of one or more intermediate films. This structure does enable the distance by which the reflector film is separated from the infrared radiation absorbing film to be maintained at a fixed value. However, at least three different kinds of films (namely, the infrared radiation absorbing film, the reflector film, and the intermediate film) need to be formed, and the thicknesses of all of them need to be controlled as detailed in the foregoing. These requirements add to the number of steps and cost required in the manufacture.

SUMMARY OF THE INVENTION

In view of the above problems, the present invention has an object to present thermal-type infrared radiation detector cells capable of achieving increased infrared radiation absorption and being manufactured in fewer and simpler steps.

Another object of the present invention is to present thermal-type infrared radiation detector cells including a diaphragm structure of a small thermal capacity, capable of achieving an increased infrared radiation absorption rate and reduced irregularities in sensitivity without adding largely to the number of steps in manufacturing process.

A thermal-type infrared radiation detector cell in accordance with the present invention has a diaphragmatic structure constituted by:

a semiconductor substrate on which there is provided an integrated circuit; and a diaphragm structural body electrically connected to, and separated by a predetermined gap from, the semiconductor substrate, wherein the diaphragm structural body includes at least:

a thermally variable resistor film changing resistance thereof upon reception of infrared rays; and metal wiring films electrically connected to the thermally variable resistor film and also to a terminal section in the substrate, wherein the metal wiring films are formed so as to constitute an infrared radiation reflector film for reflecting incident infrared rays so that the thermally variable resistor film can receive the reflected infrared rays in the diaphragm structural body.

According to the arrangement, the metal wiring films are constituted by an infrared radiation reflector film capable of reflecting infrared rays; therefore, unlike prior art, the metal wiring films in the diaphragm structural body do not interrupt the infrared rays entering the infrared radiation reflector film placed on a side of the diaphragm structural body opposite to the substrate, and thereby provides an increased effective absorption area where the diaphragm structural body can absorb infrared rays. Further, since the metal wiring film doubles as the infrared radiation reflector film, no separate step is necessary to fabricate a infrared radiation reflector film, facilitating the manufacturing process of the cell.

In the thermal-type infrared radiation detector cell arranged in this manner, it is preferable if the metal wiring films are formed so as to cover a substantial entirety of either a top surface or a bottom surface of the thermally variable resistor film.

According to the arrangement, after being reflected by the metal wiring films, the infrared rays having passed through the diaphragm structural body interferes with reflected light from the surface of the high refractive index film (dielectric film) at this surface, having its reflection substantially offset. The infrared rays are therefore efficiently absorbed by reflection and interference in the diaphragm structural body, and the diaphragm structural body greatly increases its absorption of infrared rays.

It is preferable if the metal wiring films are composed of a material capable of reflecting 95% or more of incident infrared rays entering the infrared radiation receiving section. Titanium and aluminum are good examples.

In the thermal-type infrared radiation detector cell arranged in this manner, it is preferable if the diaphragm structural body has such a substantially planar shape to provide a two-dimensionally spreading infrared radiation receiving area where infrared rays are received; and the metal wiring films are formed so as to two-dimensionally spread substantially corresponding to the infrared radiation receiving area.

This structure further ensures the function of the metal wiring films as an infrared radiation reflector film. The thermally variable resistor film may be provided on the metal wiring films, either on their top or bottom surface.

It is preferable if the thermal-type infrared radiation detector cell arranged in this manner further includes an insulating layer interposed between the thermally variable resistor film and the metal wiring films. A suitable insulating layer is primarily composed of silicon oxide.

In thermal-type infrared radiation detector cell arranged in this manner, it is preferable if the diaphragm structure is provided with an infrared ray entry surface separated from the surfaces of the metal wiring films by a distance substantially equal to ¼n times the wavelengths of incident infrared rays, where n is the refractive index of a substance interposed between the infrared ray entry surface and the surfaces of the metal wiring films.

According to the arrangement, the infrared rays reflected by the metal wiring films interferes with reflected light from the surface of the high refractive index film at this surface, having its reflection substantially offset and being absorbed by the infrared radiation absorbing film. This ensures the absorption of infrared rays by means of reflection and interference within the diaphragm structural body, and the diaphragm structural body greatly increases its absorption of infrared rays.

Another thermal-type infrared radiation detector cell in accordance with the present invention has a diaphragm structure constituted by a semiconductor substrate on which there is provided an integrated circuit; and a diaphragm structural body electrically connected to, and separated by a predetermined gap from, the semiconductor substrate, wherein the diaphragm structure further includes a high refractive index film and an infrared radiation reflector film provided beneath the high refractive index, and the high refractive index film has a thickness, d, given approximately by $$d=\lambda \times \{1/(4 \times n)\}$$

where n is a refractive index of the high refractive index film and $\lambda$ is the wavelengths of infrared rays absorbed.

According to the arrangement, the adoption of a diaphragm structure keeps the thermal conductance low with the equation being substantially satisfied in the diaphragm structure. Therefore, the diaphragm structure does not allow Joule heat produced by infrared rays to escape therefrom, and the reflection of infrared rays by the surface of the diaphragm structure is offset by interference effects. Thus, infrared rays are not allowed to escape from the diaphragm structure. The distance separating the high refractive index film from the reflector film, which influence interference effects greatly, is controlled by means of the thickness of the high refractive index film, and therefore is constant.

For these reasons, the thermal-type infrared radiation detector cell exhibits much higher and constant infrared radiation absorption rate than conventional counterparts, and thereby achieves more constant sensitivity The use of a high refractive index film enables the diaphragm structure to have a greatly reduced thickness, preventing increase in the thermal capacity of the thermal-type infrared radiation detector cell. In other words, the thermal capacity of the diaphragm structure can be greatly reduced compared to conventional technologies. As a result, an element can be prepared with a better sensitivity and shorter response time than those of conventional technologies.

Further, according to the arrangement, no infrared radiation absorbing film needs to be formed, and an increase in efficiency in infrared radiation absorption can be achieved structurally through control of the thickness of the high refractive index film alone. So, no additional steps are required in the manufacturing process. Rather, the manufacturing process can be simplified and the manufacturing cost is reduced, due to the fact that no infrared radiation absorbing film needs to be formed. The thermal-type infrared radiation detector cell thereby boasts excellent performance and are prepared at a reduced cost.

In the thermal-type infrared radiation detector cell arranged in the above manner, it is preferable if the diaphragm structural body further includes a thermally variable resistor film that changes its electric resistance with temperature variations and metal wiring films electrically connected to the thermally variable resistor film.

According to the arrangement, the infrared radiation absorption by the high refractive index film increases temperature. The rise in temperature then changes the electric conductance, hence resistance, of the thermally variable resistor film changes accordingly. As a result, infrared rays absorbed by the high refractive index film are converted to electric signals, passed through the metal wiring films electrically connected the thermally variable resistor film, and detected efficiently. Therefore, it is better ensured that infrared rays are detected.

In the thermal-type infrared radiation detector cell arranged in the above manner, it is preferable if there is provided an insulating layer between the infrared radiation reflector film and the thermally variable resistor film.

According to the arrangement, the provision of an insulating layer between the infrared radiation reflector film and the thermally variable resistor film prevents heat, which is intended to heat the thermally variable resistor film, from flowing through the highly heat conductive infrared radiation reflector film. Thus the thermally variable resistor film is efficiently heated. As a result, the thermal-type infrared radiation detector cell has improved sensitivity.

In the thermal-type infrared radiation detector cell arranged in the above manner, it is preferable if there is provided at least a thermally variable resistor film between the high refractive index film and the infrared radiation reflector film.

According to the arrangement, the thermally variable resistor film is placed closely to the high refractive index film producing heat by means of infrared radiation absorption. Therefore, the heat from the high refractive index film is prevented from flowing into the infrared radiation reflector film before reaching the thermally variable resistor film. Thus the thermally variable resistor film is efficiently heated. As a result, the thermal-type infrared radiation detector cell has improved sensitivity.

In the thermal-type infrared radiation detector cell arranged in the above manner, it is preferable if the infrared radiation reflector film doubles as the metal wiring films.

According to the arrangement, the metal wiring films double as the infrared radiation reflector film; therefore, no step is required to deposit an infrared radiation reflector film and fabricate it into a predetermined shape. Thus the thermal-type infrared radiation detector cell has a simplified structure, and is manufactured at a further reduced cost.

In the thermal-type infrared radiation detector cell arranged in the above manner, it is preferable if there is provided an insulating layer between the high refractive index film and the infrared radiation reflector film.

According to the arrangement, the high refractive index film is insulated from the infrared radiation reflector film; therefore, no sense current branches out from the thermally variable resistor film to the high refractive index film. Thus, changes in the resistance of the thermally variable resistor film caused by infrared radiation absorption can be efficiently detected, and the thermal-type infrared radiation detector cell has further improved sensitivity.

Besides, according to the arrangement, no sense current branches out to the high refractive index film; therefore, the heat resistance variation of the thermally variable resistor film can be increased by increasing its resistivity. As a result, the thermal-type infrared radiation detector cell has further improved sensitivity. Further, since no sense current branches out to the high refractive index film, the high refractive index film itself can have a reduced resistivity. Therefore, the high refractive index film can have an increased refractive index, and thus reduced thickness. As a result, the thermal-type infrared radiation detector cell has improved time resolution.

In the thermal-type infrared radiation detector cell arranged in the above manner, it is preferable if the diaphragm structure includes a supporting member for supporting the diaphragm structural body over the semiconductor substrate while maintaining a predetermined gap therebetween, wherein the metal wiring films are provided on the supporting member, and there is provided an insulating layer to cover the metal wiring films formed on at least the supporting member.

According to the arrangement, the insulating layer covers the metal wiring films on the supporting member, and thereby provides protection to the normally exposed metal wiring films on the supporting member. As a result, the thermal-type infrared radiation detector cell has improved environmental insusceptibility.

In the thermal-type infrared radiation detector cell arranged in the above manner, it is preferable if the high refractive index film is primarily composed of either silicon or germanium.

In the thermal-type infrared radiation detector cell arranged in the above manner, the high refractive index film may double as the thermally variable resistor film.

According to the arrangement, the dues role of the high refractive index film as the thermally variable resistor film enables omission of the step to deposit an infrared radiation reflector film and fabricate it into a predetermined shape. Thus the thermal-type infrared radiation detector cell has a simplified structure, and is manufactured at a further reduced cost. In the arrangement, the high refractive index film is, suitably, composed primarily of silicon.

Another thermal-type infrared radiation detector cell in accordance with the present invention includes:

a semiconductor substrate on which there is provided an integrated circuit; and a substantially planar diaphragm structural body electrically connected to, and separated by a predetermined gap, from the semiconductor substrate, wherein the diaphragm structural body is provided with at least: an infrared ray entry surface through which infrared rays enter; and an infrared radiation reflector surface by which infrared rays having entered the diaphragm structural body are reflected, the infrared radiation reflector surface being disposed beneath the infrared ray entry surface, and the infrared ray entry surface is separated from the infrared radiation reflector surface by a distance specified substantially equal to $\frac{1}{4}n$ times the wavelengths of incident infrared rays, where n is a refractive index of a substance interposed between the infrared ray entry surface and the infrared radiation reflector surface.

According to the arrangement, with respect to the infrared rays having been reflected either by the metal wiring films or by infrared radiation reflector film, the reflection by the infrared ray entry surface is substantially offset. Therefore, infrared rays are absorbed by means of reflection and interference in the infrared radiation receiving section, and no separate infrared radiation absorbing film needs to be formed. As a result, the thermal-type infrared radiation detector cell absorbs a greater amount of infrared rays, thus improves sensitivity in detecting infrared rays, and has a simplified structure.

An image capture device in accordance with the present invention incorporates a thermal-type infrared radiation detector cell arranged in one of the above manners. According to the arrangement, thermal-type infrared radiation detector cells arranged in one of the above manners is used to constitute image capture elements; therefore, pixels exhibit infrared radiation absorption rates that are far more constant in the infrared radiation image capture element than in the image capture device incorporating conventional infrared radiation detector cells. Consequently, the image capture device in accordance with the present invention has sensitivity that varies less from pixel to pixel, and capable of capture higher quality images than conventional counterparts.

For a fuller understanding of the nature and advantages of the invention, reference should be made to the ensuing detailed description taken in conjunction with the accompanying drawings.

DESCRIPTION OF THE EMBODIMENTS

[Embodiment 1]

Referring to drawings, the following description will discuss an embodiment in accordance with the present invention. The embodiment by no means constitutes a limitation on the scope of the present invention.

Figure 1A:
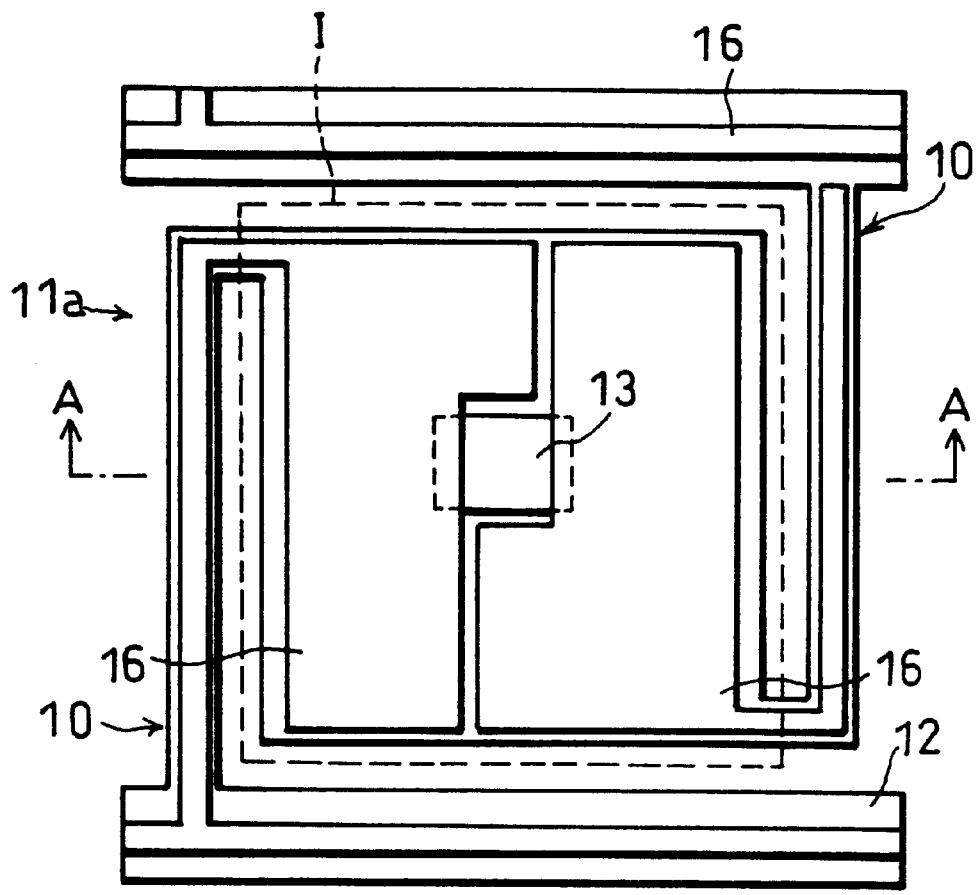
FIG. 1(a) is a plan view schematically showing the structure of a thermal-type infrared radiation detector cell of an embodiment in accordance with the present invention.

As shown in FIG. 1(a), a thermal-type infrared radiation detector cell of the present embodiment constitutes an infrared radiation sensor including an infrared radiation receiving section 11a of a diaphragm structure (hereinafter, will be referred to as a diaphragm structural body). The diaphragm structure, as shown in FIG. 1(b), includes: a semiconductor substrate 17 on which there is provided an integrated circuit; and a diaphragm structural body 11a electrically connected to, but spatially separated by a predetermined gap from, the semiconductor substrate 17.

Figure 1B:
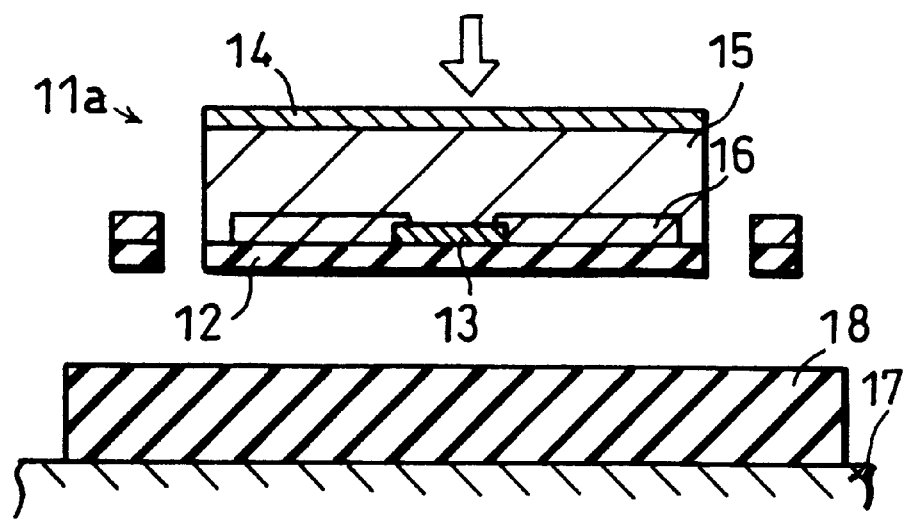
FIG. 1(b) is a cross-sectional view taken along line A—A in FIG. 1(a).
Figure 2:
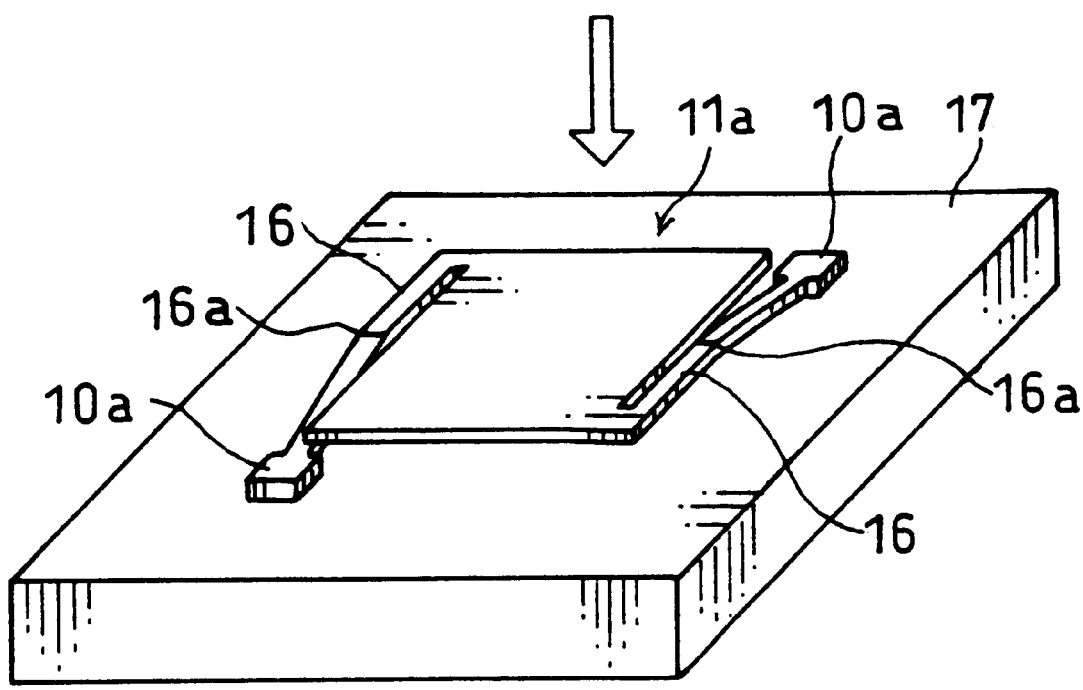
FIG. 2 is a perspective view showing the thermal-type infrared radiation detector cell shown in FIGS. 1(a) and 1(b).

As shown in FIG. 1(b), in the infrared radiation sensor, the diaphragm structural body 11a is electrically connected to a semiconductor substrate (substrate) 17, on which an integrated circuit (not shown) is provided so that a predetermined gap is ensured between the diaphragm structural body 11a and the integrated circuit. A specific example is shown in FIG. 2, in which metal wiring films 16 are provided to the diaphragm structural body 11a so as to electrically connect the diaphragm structural body 11a to the semiconductor substrate 17, but spatially separate the diaphragm structural body 11a from the semiconductor substrate 17 with a predetermined gap. In FIG. 1(b), the wiring connecting the diaphragm structural body 1 to the semiconductor substrate 7 is omitted.

By adopting a diaphragm structure in a thermal-type infrared radiation detector cell in this manner, the diaphragm structural body 11a constituting an infrared radiation receiving section can be substantially thermally insulated from the semiconductor substrate 17. This is because the heat in the diaphragm structural body 11a produced by the incident infrared rays does not flow into the semiconductor substrate 17.

As shown in FIG. 1(a), the diaphragm structural body 11a is arranged to include a thermally variable resistor film 13 and metal wiring films 16 being formed on a second silicon oxide film 12 that is patterned in a predetermined manner.

On top of the thermally variable resistor film 13 and the metal wiring films 16, as shown in FIG. 1(b), there are sequentially provided a high refractive index film (dielectric film) 15 and an infrared radiation absorbing film 14 according to the pattern of the second silicon oxide film 12.

The thermally variable resistor film 13 changes its resistance in response to heat, and is suitably made from a titanium oxide, a vanadium oxide, or another similar material.

The metal wiring films 16 are electrically connected to the thermally variable resistor film 13 and adapted to reflect 95% or more of the infrared rays entering the diaphragm structural body 11a. Therefore, the metal wiring films 16 double as an infrared radiation reflector film. With a reflection index of the metal wiring films 16 as high as 95% or even higher, the infrared radiation absorbing film 14 shows higher absorption. The metal wiring films 16 are made from titanium (Ti), aluminum (Al), or another metal, to name a few typical examples.

The metal wiring films 16, if composed of Ti, exhibit a low thermal conductivity of 22 W/(m·K) and a high resistivity of 43.1 $\mu\Omega$cm. Thus, the Ti wiring films offer a low thermal conductance option.

The metal wring film 16, if composed of Al, exhibits a high thermal conductivity of 236 W/(m·K) and a low resistivity of 2.74 $\mu\Omega$cm. Thus, the Al wiring films offer a low wiring resistance option.

The metal wiring films 16 are designed taking the resistance (noise) and thermal conductance (sensitivity) of the detector cell into consideration. In the present embodiment, sensitivity is given priority, resulting in the use of titanium. However, the choice by no means constitute a limitation on the scope of the present invention The metal wiring films 16 are formed, as shown in FIG. 1(a), so as to occupy almost all of a infrared radiation receiving area I in the diaphragm structural body 11a. Specifically, the diaphragm structural body 11a has such a substantially planar shape to ensure the provision of the two-dimensionally spreading, infrared radiation receiving area I where infrared rays are received, whereas the metal wiring films 16 are formed so as to two-dimensionally spread substantially corresponding to the infrared radiation receiving area I.

In the present embodiment, the thermally variable resistor film 13 is formed to be smaller than the metal wiring films 16 in the infrared radiation receiving area however, the area of the thermally variable resistor film 13 in the infrared radiation receiving area I is not limited in any particular manner. The thermally variable resistor film 13 may be of the same shape as the diaphragm structural body 11a.

The infrared radiation absorbing film 14 disposed on top of the high refractive index film 15 is a NiCr, TiN, or other metal thin film or a nitride thin film with a sheet resistance of 377 $\Omega/\square$, and has functions to prevent the diaphragm structural body 11a from reflecting incoming infrared rays and absorb the infrared rays.

The high refractive index film 15 is disposed so as to cover the thermally variable resistor film 13 and the metal wiring films 16, and adapted to have such a thickness that the distance by which the infrared radiation absorbing film 14 is separated from the metal wiring films 16 is substantially equal to ¼n times the wavelengths, $\lambda$, of incident infrared rays. Note that n is the refractive index of the high refractive index film 15. The infrared rays reflected by the metal wiring films 16 is offset at the surface of the high refractive index film 15 by means of interference with reflected light from the surface of the high refractive index film 15, and absorbed again by the infrared radiation absorbing film 14.

The diaphragm structural body 11a thus arranged is electrically connected to the semiconductor substrate 17 via connecting electrodes 10a positioned at the tips of the metal wiring films 16, for example, as shown in FIG. 2.

Each connecting electrode 10a is fabricated by a predetermined process from a leg 10 of the metal wiring film 16 that extends external to the infrared radiation receiving area I in the diaphragm structural body 11a shown in FIG. 1(a).

Now, referring to FIG. 3(a) through FIG. 3(e), the following description will discuss a manufacturing method for the infrared radiation sensor arranged in the foregoing manner.

Figure 3A:
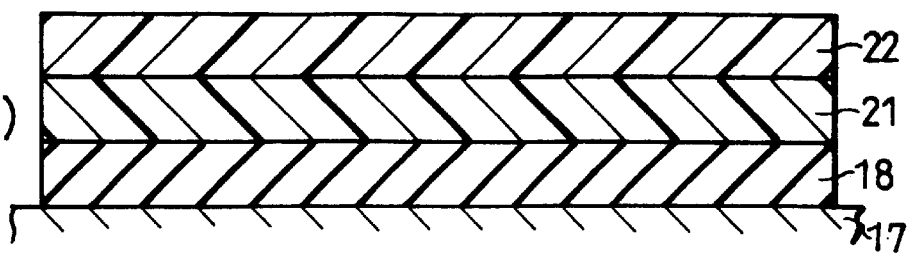
FIGS. 3(a) to 3(e) are explanatory drawings showing a manufacturing process of an infrared radiation sensor incorporating the thermal-type infrared radiation detector cell shown in FIG. 1(b).

First, as shown in FIG. 3(a), a silicon oxide layer (first silicon oxide film 18) is formed on a silicon substrate (semiconductor substrate 17) so as to provide protection to an integrated circuit fabricated on the silicon substrate. Thereafter, the surface of the silicon oxide layer is flattened by CMP (Chemical Mechanical Polishing) or reflow by way of heat application. Polyimide is then applied to the entire surface and baked in an about 350° C. thermal process to form a polyimide film 21.

Here, the polyimide film 21 is adapted to have a thickness of about 2 $\mu$m, for example. However, the thickness of the polyimide film 21 does not affect the absorption rate of infrared rays, and therefore can be specified freely to suit other parts of the manufacturing process.

Subsequently, resist 22 is applied to the entire surface of the polyimide film 21, and photo-etched in a desired pattern, followed by baking at about 150° C. Here, the grounding part of a bridge is tapered. The bridge corresponds to the leg 10 shown in FIG. 1(a) and is fabricated into a bending section 16a of a metal wiring film 16 shown in FIG. 2.

Figure 3B:
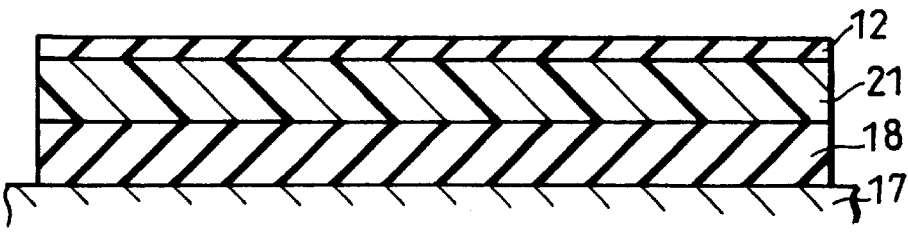

Subsequently, the entire surface of the resist 22 is dry-etched, the resist pattern is copied to the polyimide film 21, and the resist 22 is removed using a removing liquid. Further, as shown in FIG. 3(b), a silicon oxide film (second silicon oxide film 12) is deposited with a thickness of about 200 nm on the entirety of the patterned polyimide film 21 by P-CVD (Plasma-Chemical Vapor Deposition).

Figure 3C:
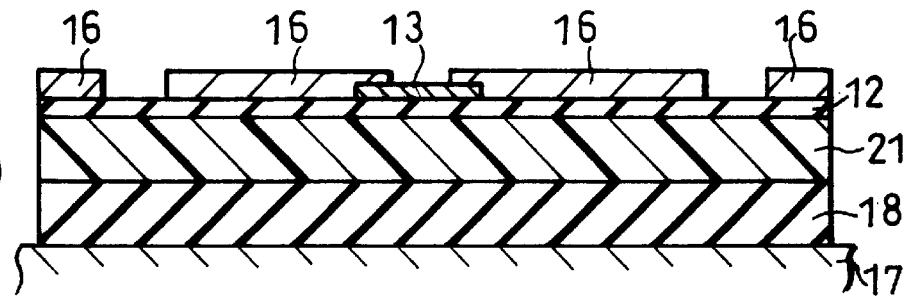
Figure 3D:
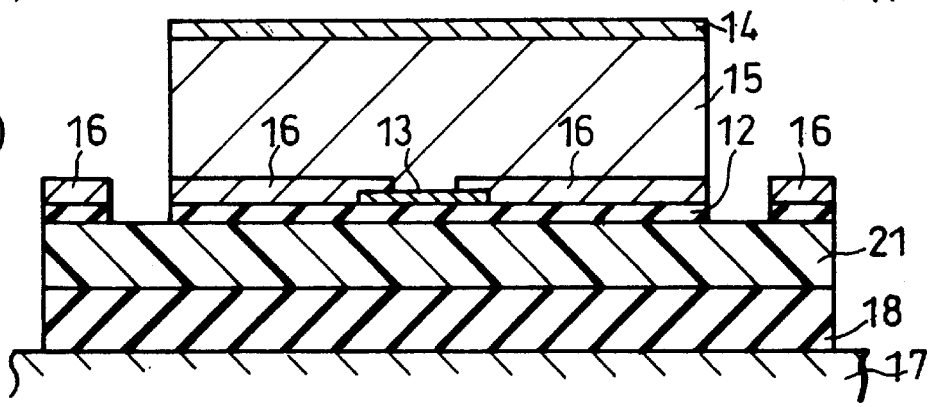
Figure 3E:
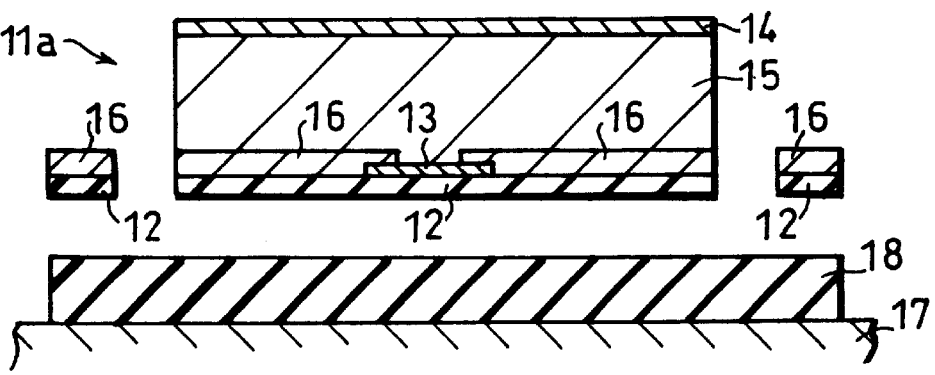

Next, as shown in FIG. 3(c), to provide a diaphragm structural body 11a (FIG. 3(e)) over the second silicon oxide film 12, a thermally variable resistor film 13 and metal wiring films 16 are deposited by sputtering or another similar technology. The thermally variable resistor film 13 is about 100 nm thick. The metal wiring films 16, made of titanium (Ti) and other similar substances, are about 100 nm thick and have a reflection index of 95% or higher. Here, as shown in FIG. 1(a), :the thermally variable resistor film 13 is disposed so that the metal wiring films 16 cover almost all of the infrared radiation receiving area I in the diaphragm structural body 11a.

Next, a 730 nm-thick silicon film, as a high refractive index film 15, is deposited on the whole top surfaces of the thermally variable resistor film 13 and the metal wiring films 16 by sputtering or another similar technology. Thereafter, an infrared radiation absorbing film 14 with a sheet resistance of about 377$\Omega/\square$ is deposited by sputtering or another similar technology. The thickness of the silicon film determines the distance between the metal wiring films 16 and the infrared radiation absorbing film 14 to ¼n times the wavelengths, $\lambda$, of incident infrared rays (n is the refractive index of the high refractive index film 15).

After aligning the diaphragm structural body 11a to a predetermined position, the silicon film and the second silicon oxide film 12 are removed from predetermined areas by dry-etching technologies to realize the structure shown in FIG. 3(d).

Finally, the polyimide film 21 is removed by dry-etching, especially, oxygen ashing technologies to complete the manufacture of infrared radiation sensor with a structure shown in FIG. 3(e).

As detailed so far, the infrared radiation sensor in accordance with the present invention has a structure in which the diaphragm structural body 11a has internal metal wiring films 16 for the purposes of both reflecting infrared radiation and wiring. The structure simplifies the manufacturing process by eliminating the conventional need to fabricate reflector and wiring films in separate steps.

In the infrared radiation sensor thus structured, incident infrared rays, i.e., the infrared rays received by the diaphragm structural body 11a passes through the infrared radiation absorbing film 14 which possesses a sheet resistance of 377 $\Omega/\square$ and then the high refractive index film 15, and are partly received directly by the thermally variable resistor film 13. Part of the infrared rays, having passed through the infrared radiation absorbing film 14, but not received by the thermally variable resistor film 13, is reflected by the metal wiring films 16 disposed near the thermally variable resistor film 13.

Since the metal wiring films 16 are separated from the infrared radiation absorbing film 14 by a distance equal to ¼n times the wavelengths, $\lambda$, of the incident infrared rays (n is the refractive index of the high refractive index film 15), the infrared rays having reflected by the metal wiring films 16 interfere at the surface of the high refractive index film 15 with reflected light from this surface, having the reflection offset and being absorbed by the infrared radiation absorbing film 14 again. The infrared rays received by the diaphragm structural body 11a are thus absorbed by the diaphragm structural body 11a as a result of interference:and reflection by the metal wiring films 16.

An ideal metal wiring film 16 should be capable of completely reflecting infrared rays. However, in practice, titanium, 100 nm-thick wiring films 16 with a sheet resistance of about 20 Ω/□ are popularly used as described in the foregoing, and still possesses a sufficiently high reflection index of 95% or higher. Even after counting out the infrared radiation absorption by the titanium wiring films 16, the use of such a metal wiring films 16 enable the diaphragm structural body 11a as a whole to absorb about 80% or more of infrared rays in the effective area, which is comparable to the absorption rate achieved by the use of a conventional, low-resistance complete reflection film.

In addition, in the diaphragm structural body 11a structured as in the foregoing, since the metal wiring films 16 help the diaphragm structural body 11a absorb infrared radiation as detailed in the foregoing, the fill factor, representative of the ratio of the infrared radiation receiving area I to the overall size of the thermal-type infrared radiation detector cell, can be raised to 65% or even further by fabricating the metal wiring films 16 so as to occupy a greatest area possible in the diaphragm structural body 11a.

Figure 16A:
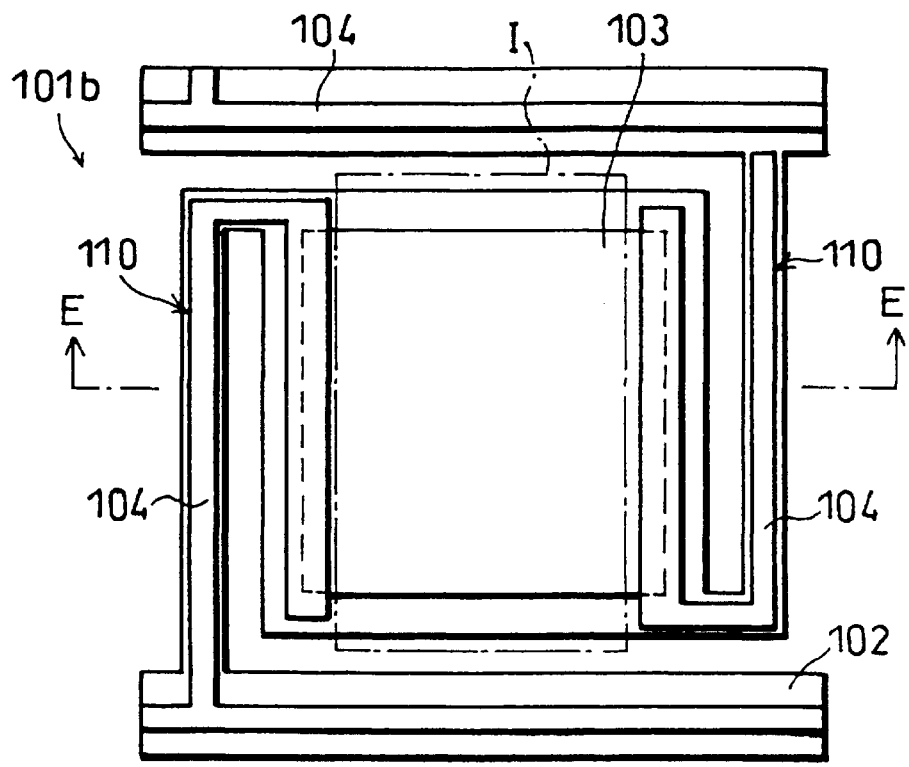
FIG. 16(a) is a plan view showing another conventional thermal-type infrared radiation detector cell as an example.
Figure 16B:
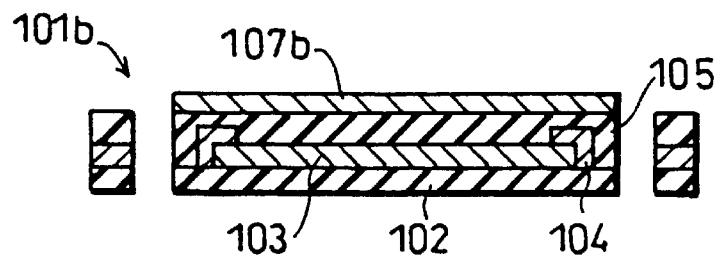
FIG. 16(b) is a cross-sectional view taken along line E—E shown in FIG. 16(a).
Figure 16B:
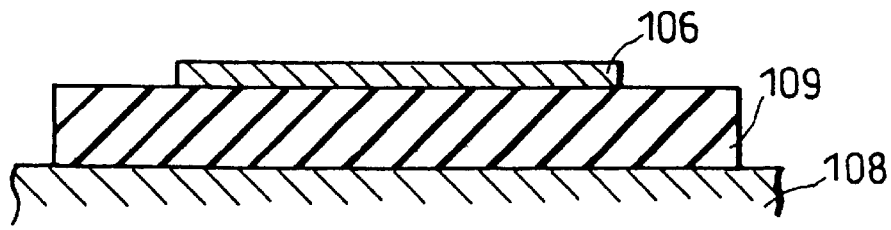

Thus, the thermal-type infrared radiation detector cell as a whole is capable of absorbing 52% (=80%×0.65) of incident infrared rays. This translates to a more than 10% improvement over the conventionally structured thermal-type infrared radiation detector cell as a whole, shown in FIGS. 16(a) and 16(b), absorbing 40% of incident infrared rays.

Figure 4:
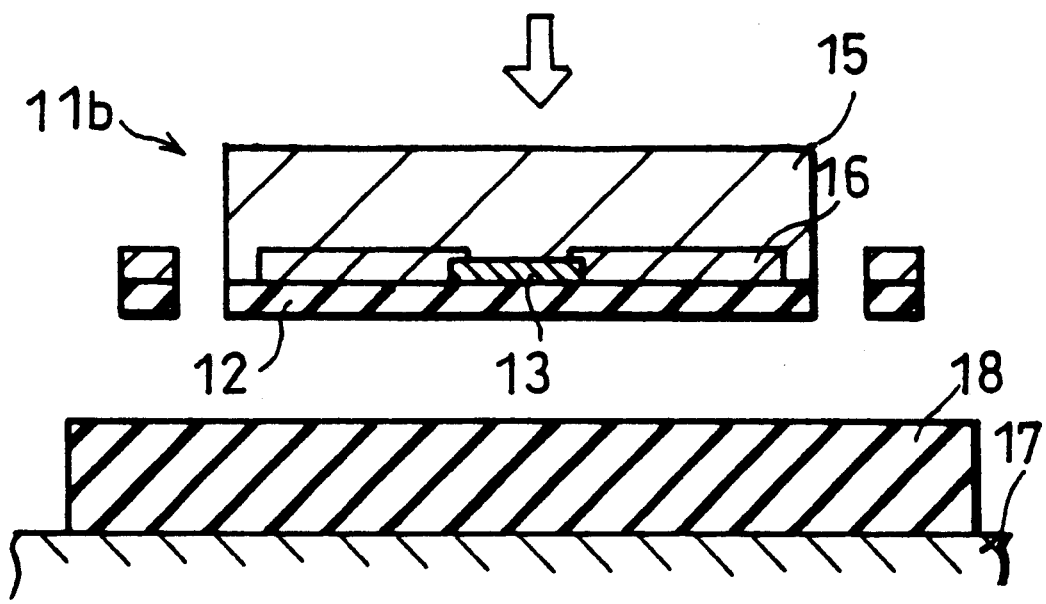
FIG. 4 is a cross-sectional view schematically showing the thermal-type infrared radiation detector cell shown in FIG. 1(b) minus the infrared radiation absorbing film.

In the present embodiment, an infrared radiation absorbing film 14 is placed on the surface of the diaphragm structural body 11a through which incident infrared rays enter as an example. An alternative structure is shown in FIG. 4, in which a diaphragm structural body 11b is provided without an infrared radiation absorbing film. In this structure, the thickness of the high refractive index film 15 should be specified so as to offset the reflection by the surface of the diaphragm structural body 11b. Thus, infrared rays are absorbed by the diaphragm structural body 11b as a result of its internal interference without an infrared radiation absorbing film. The omission of the infrared radiation absorbing film simplifies the manufacturing process.

A thermal-type infrared radiation detector cell in accordance with the present invention, as detailed in the foregoing, includes a diaphragmatic structural body including:

a thermally variable resistor film changing resistance thereof upon reception of infrared rays; and metal wiring films electrically connected to the thermally variable resistor film and also to a terminal section in a substrate on which there is provided an integrated circuit, wherein metal wiring films is constituted by an infrared radiation reflector film capable of reflecting infrared rays.

In the thermal-type infrared radiation detector cell, the metal wiring film is constituted by an infrared radiation reflector film capable of reflecting infrared rays; therefore, no separate step is necessary to fabricate a reflector film, facilitating the manufacturing process of the cell. Therefore, unlike prior art, the metal wiring films in the diaphragm structural body do not interrupt the infrared rays entering the infrared radiation reflector film placed on a side of the diaphragm structural body opposite to the substrate, and thereby provides an increased effective absorption area where the diaphragm structural body can absorb infrared rays.

Here, the distance separating the metal wiring films from the surface of the diaphragm structural body through which infrared rays enter is preferably set to about ¼n times the wavelengths of incident infrared rays (n is the refractive index of the substance interposed between the metal wiring films and the surface through which infrared rays enter). See embodiment 4 for more details. In this situation, the incident infrared rays entering the diaphragm structural body are reflected by the metal wiring films. Since the distance between the metal wiring films and the surface of the diaphragm structural body through which infrared rays enter is set substantially equal to ¼n times the wavelengths of incident infrared rays, the reflection of the infrared rays reflected by the metal wiring films is substantially offset which occurs at the surface of the diaphragm structural body through which infrared rays enter. Therefore, a substantial entirety of the incident infrared rays entering the diaphragm structural body is absorbed by the diaphragm structural body.

Further, since the metal wiring films are constituted by an infrared radiation reflector film capable of reflecting infrared rays, the infrared rays entering the diaphragm structural body and subsequently reflected by the metal wiring films are absorbed by the diaphragm structural body. Also, the metal wiring films provided in the diaphragm structural body double as a reflector film in accordance with the structure of the present embodiment; therefore, unlike prior art, the metal wiring films neither interrupt the infrared rays entering the infrared radiation reflector film placed on a side of the diaphragm structural body opposite to the substrate, nor reduce the effective absorption area where the diaphragm structural body can absorb infrared rays.

The partial area of the metal wiring films belonging to the infrared radiation receiving area in the diaphragm structural body may be adapted to be greater than the area of the thermally variable resistor film.

The metal wiring films are composed of titanium (Ti), aluminum (Al), or another similar material. Under these conditions, the metal wiring films are designed taking the resistance (noise) and thermal conductance (sensitivity) of the detector cell into consideration.

The metal wiring films, if composed of Ti, exhibit a low thermal conductivity of 22 W/(m·K) and a high resistivity of 43.1 μΩcm. Thus, the Ti wiring films offer a low thermal conductance option, but increases the wiring resistance. By contrast, the metal wring film, if composed of Al, exhibits a high thermal conductivity of 236 W/(m·K) and a low resistivity of 2.74 μΩcm. Thus, the Al wiring films offer a low wiring resistance option, but increases the thermal conductance and hence only achieves lower sensitivity than a Ti wiring film.

In a thermal-type infrared radiation detector cell in accordance with the present invention, the diaphragm structural body has such a substantially planar shape to ensure the provision of the two-dimensionally spreading infrared radiation receiving area where infrared rays are received, whereas the metal wiring films are formed so as to two-dimensionally spread substantially corresponding to the infrared radiation receiving area. This structure further ensures the function of the metal wiring films as an infrared radiation reflector film.

[Embodiment 2]

Referring to drawings, the following description will discuss another embodiment in accordance with the present invention. Here, for convenience, members of the present embodiment that have the same arrangement and function as members of embodiment 1, and that are mentioned in embodiment 1 are indicated by the same reference numerals and description thereof is omitted. The embodiment by no means constitutes a limitation on the scope of the present invention.

Figure 5A:
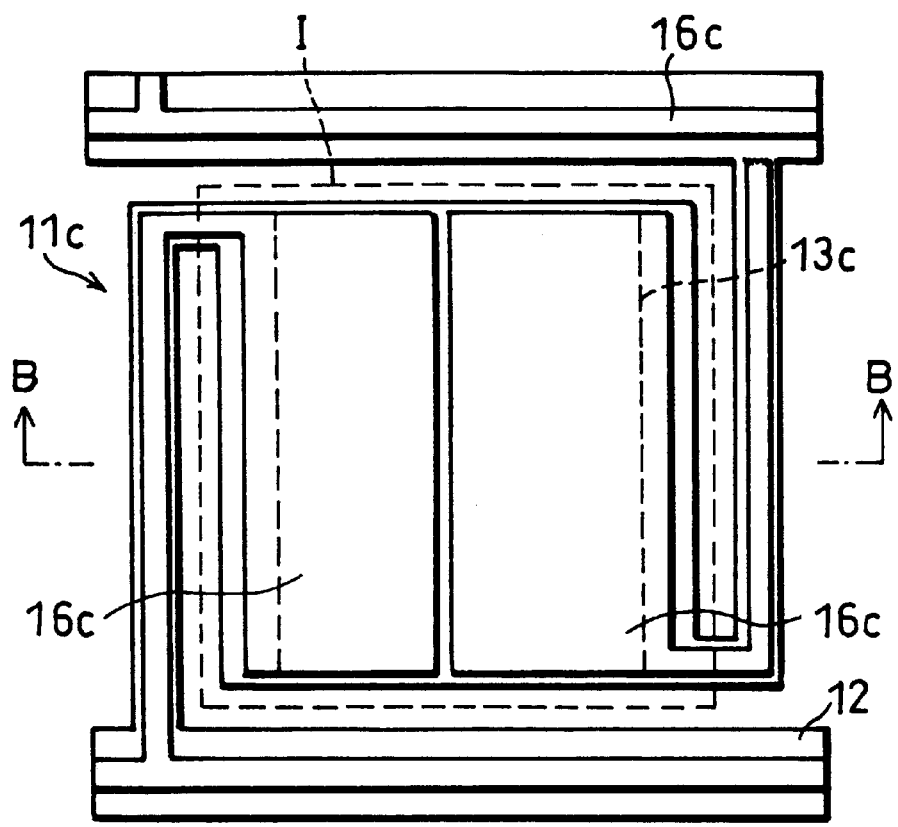
FIG. 5(a) is a plan view schematically showing the structure of a thermal-type infrared radiation detector cell of another embodiment in accordance with the present invention.
Figure 5B:
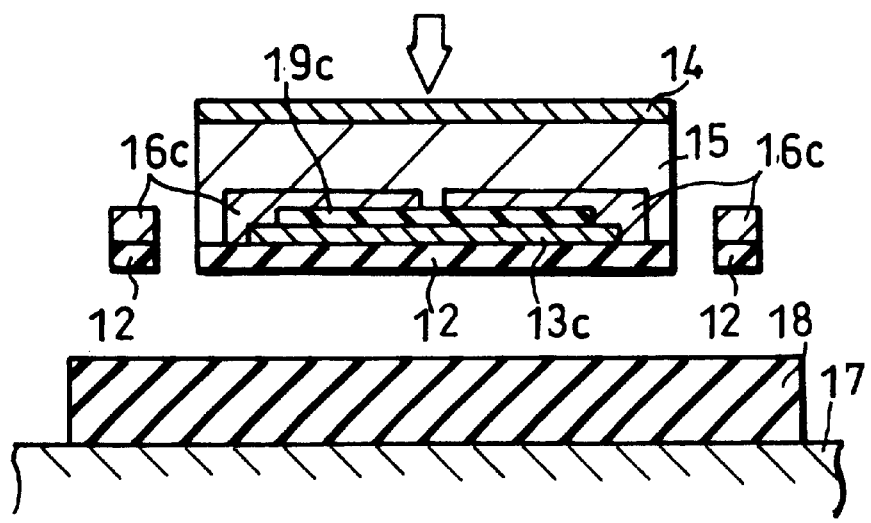
FIG. 5(b) is a cross-sectional view taken along line B—B shown in FIG. 5(a).

Referring to FIGS. 5(a) and 5(b), a thermal-type infrared radiation detector cell of the present embodiment constitutes an infrared radiation sensor including a diaphragm structural body 11c in place of the diaphragm structural body 11a of embodiment 1.

As shown in FIG. 5(b), the diaphragm structural body 11c has a structure in which a third silicon oxide film 19c is provided for insulation purposes between a thermally variable resistor film 13c and metal wiring films 16c on a second silicon oxide film 12.

The structure in which the thermally variable resistor film 13c and the metal wiring films 16c are provided via the third silicon oxide film 19c increases the resistance and thereby the detection output of the thermally variable resistor film 13c.

Here, as shown in FIG. 5(a), the thermally variable resistor film 13c, formed on the second silicon oxide film 12, is somewhat smaller than a infrared radiation receiving area I in the diaphragm structural body 11c; however, the thermally variable resistor film 13c may be of the same size as the infrared radiation receiving area I.

The metal wiring films 16c, as shown in FIG. 5(b), are formed so as to cover the thermally variable resistor film 13c and the third silicon oxide film 19c.

The structure in which the third silicon oxide film 19c is provided for insulation purposes between the thermally variable resistor film 13c and the metal wiring films 16c enable the thermally variable resistor film 13c to be connected at its sides to the metal wiring films 16c and thereby allows the thermally variable resistor film 13c, which serves as a resistor, to have an elongated shape and hence higher resistance.

Therefore, the structure incorporated in the diaphragm structural body 11c can achieve a higher detection output without changing the resistance variation of the thermally variable resistor film 13c. However, the resistance of the thermally variable resistor film 13c cannot be limitlessly increased in view of heat noise. The structure is especially effective when incorporated in a diaphragm structural body 11c with a thermally variable resistor film 13c made of a material with a generally low resistivity which, however, changes in response to heat applied.

The present embodiment, although involving additional steps to fabricate the third silicon oxide film 19c when compared to embodiment 1, still requires almost the same number of steps in the whole manufacturing process of a thermal-type infrared radiation detector cell as conventional detector cells.

In addition, in the diaphragm structural body 11c structured as in the foregoing, since the metal wiring films 16c help the diaphragm structural body 11c absorb infrared radiation similarly to embodiment 1, the fill factor, representative of the ratio of the infrared radiation receiving area I to the overall size of the diaphragm structural body 11c, can be raised.

Hence, the thermal-type infrared radiation detector cell as a whole is capable of absorbing a greater proportion of incident infrared rays than do conventionally structured thermal-type infrared radiation detector cells.

In the present embodiment, an infrared radiation absorbing film 14 is placed on the surface of the diaphragm structural body 11c through which incident infrared rays enter as an example. Similarly to embodiment 1 (see FIGS. 1(a) and 1(b)), an alternative structure is possible, in which a diaphragm structural body is provided without an infrared radiation absorbing film. In this structure, the thickness of the high refractive index film 15 should be specified so as to offset the reflection by the surface of the diaphragm structural body. The omission of the infrared radiation absorbing film simplifies the manufacturing process.

As detailed so far, in accordance with the present invention, the thermal-type infrared radiation detector cell may be such that the metal wiring films are formed so as to cover a substantial entirety of the top surface of the thermally variable resistor film.

In the event, the incident infrared rays having entered and subsequently passed through the diaphragm structural body are reflected by the metal wiring films disposed on the top surface of the thermally variable resistor film via the third silicon oxide film for example. After offsetting the reflection by high refractive index film, the infrared rays reflected by the metal wiring films are absorbed again by the infrared radiation absorbing film fabricated from a metal or nitride thin film disposed on top of the diaphragm structural body. Thus, the expansion of the metal wiring films greatly improves the absorption of infrared rays by the diaphragm structural body.

The formation of the metal wiring films from an infrared radiation reflector film capable of reflecting infrared rays eliminates the need for a separate step to fabricate a reflector film, facilitating the manufacturing process.

Alternatively, as detailed above, the thermal-type infrared radiation detector cell in accordance with the present invention may include an insulating layer interposed between the thermally variable resistor film and the metal wiring films. The provision of the insulating layer increases the resistance of the thermally variable resistor film and thereby the detection output of the thermal-type infrared radiation detector cell. The insulating layer is suitably primarily composed of silicon oxide.

[Embodiment 3]

Referring to drawings, the following description will discuss another embodiment in accordance with the present invention. Here, for convenience, members of the present embodiment that have the same arrangement and function as members of any one of the previous embodiments, and that are mentioned in that embodiment are indicated by the same reference numerals and description thereof is omitted. The embodiment by no means constitutes a limitation on the scope of the present invention.

Figure 6:
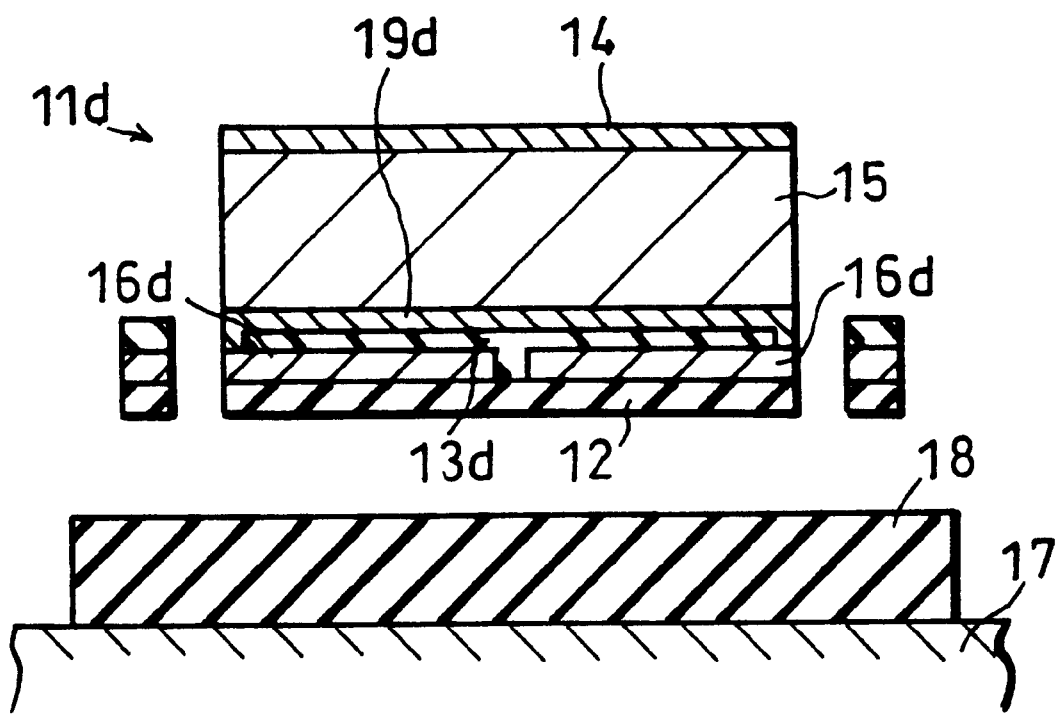
FIG. 6 is a cross-sectional view schematically showing the structure of a thermal-type infrared radiation detector cell of a further embodiment in accordance with the present invention.

As shown in FIG. 6, a thermal-type infrared radiation detector cell of the present embodiment constitutes an infrared radiation sensor including a diaphragm structural body 11d in place of the diaphragm structural body 11a of embodiment 1.

The diaphragm structural body 11d includes metal wiring films 16d, a thermally variable resistor film 13d, and a third silicon oxide film 19d formed sequentially on a second silicon oxide film 12. The third silicon oxide film 19d is dispensable if the high refractive index film 15 has a sufficiently high resistivity. The diaphragm structural body 11d differs from the diaphragm structural body 11c of embodiment 2 in that the metal wiring films 16d and the thermally variable resistor film 13d are reversed in their relative positions.

Similarly to embodiments 1 and 2, in the diaphragm structural body 11d thus structured, the infrared radiation absorption is improved by setting the distance separating the metal wiring films 16d from the infrared radiation absorbing film 14 to about ¼n times the wavelengths, $\lambda$, of incident infrared rays (n is the refractive index of the high refractive index film 15). Specifically, the combined thickness of the thermally variable resistor film 13d, the third silicon oxide film 19d, and the high refractive index film 15 should be equivalently set to about ¼n times the wavelengths, λ, of incident infrared rays.

Similarly to embodiment 2, the present embodiment, although involving an additional step to fabricate the third silicon oxide film 19d when compared to embodiment 1, still requires almost the same number of steps in the whole manufacturing process of a thermal-type infrared radiation detector cell as conventional detector cells.

In the diaphragm structural body 11d detailed in the foregoing, the thermally variable resistor film 13d is placed on the metal wiring films 16d, and is therefore provides an expanded area where incident infrared rays entering the diaphragm structural body 11d are received directly at the thermally variable resistor film 13d.

Further, the placement of the third silicon oxide film 19d on top of the thermally variable resistor film 13d allows for the use of a Ge or another similarly low-resistivity dielectric film.

In the present embodiment, an infrared radiation absorbing film 14 is placed on the surface of the diaphragm structural body 11d through which incident infrared rays enter as an example. Similarly to embodiment 2, an alternative structure is possible (see FIGS. 1(a) and 1(b)), in which a diaphragm structural body is provided without an infrared radiation absorbing film. In this structure, the thickness of the high refractive index film 15 should be specified so as to offset the reflection by the surface of the diaphragm structural body. The omission of the infrared radiation absorbing film simplifies the manufacturing process.

As detailed so far, in accordance with the present invention, the thermal-type infrared radiation detector cell may be such that the metal wiring films are formed so as to cover a substantial entirety of the bottom surface of the thermally variable resistor film.

In the event, the incident infrared rays having entered the diaphragm structural body and subsequently passed through the thermally variable resistor film are reflected by the metal wiring films disposed on the bottom surface of the thermally variable resistor film. Reflected by the metal wiring films, the infrared rays enters the thermally variable resistor film again, and are partly absorbed by the thermally variable resistor film with the rest passing through the thermally variable resistor film.

After offsetting the reflection by the high refractive index film, the infrared rays having been reflected by the metal wiring films and passed through the thermally. variable resistor film are absorbed again by the infrared radiation absorbing film fabricated from a metal or nitride thin film disposed on top of the diaphragm structural body. Thus, the expansion of the metal wiring films greatly improves the absorption of infrared rays by the diaphragm structural body.

The expansion of the metal wiring films hence greatly improves the absorption of infrared rays by the thermal-type infrared radiation detector cell.

The formation of the metal wiring films from an infrared radiation reflector film capable of reflecting infrared rays eliminates the need for a separate step to fabricate a reflector film, facilitating the manufacturing process.

As clearly shown in embodiment 2 and the present embodiment, the thermally variable resistor film is disposed on the metal wiring films, either on their top or bottom surface. The specific position of the thermally variable resistor film should be appropriately determined depending on the characteristics required in the thermally variable resistor film, and is not limited by any particular manner.

[Embodiment 4]

Referring to drawings, the following description will discuss another embodiment in accordance with the present invention. Here, for convenience, members of the present embodiment that have the same arrangement and function as members of any of the previous embodiments, and that are mentioned in that embodiment are indicated by the same reference numerals and description thereof is omitted. The embodiment by no means constitutes a limitation on the scope of the present invention.

A thermal-type infrared radiation detector cell of the present embodiment includes a diaphragm structure similarly to embodiments 1 through 3. The present embodiment differs from embodiments 1 through 3 in that the metal wiring films double as an infrared radiation reflector film in the latter three embodiments, while a separate infrared radiation reflector film is provided in the former. The thermal-type infrared radiation detector cell of the present embodiment includes, as an infrared radiation absorption layer for absorb infrared rays, a high refractive index film of a thickness determined according to a predetermined relation equation and an infrared radiation reflector film formed underneath the high refractive index film.

Figure 7A:
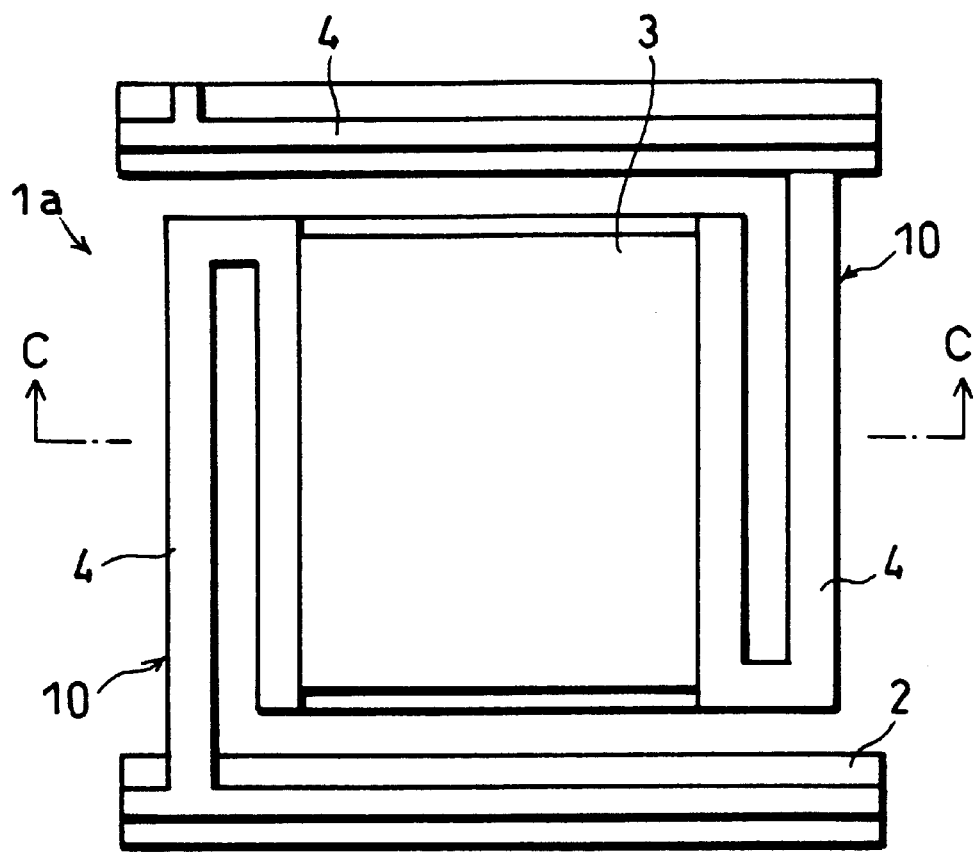
FIG. 7(a) is a plan view schematically showing the structure of a thermal-type infrared radiation detector cell of another embodiment in accordance with the present invention.
Figure 7B:
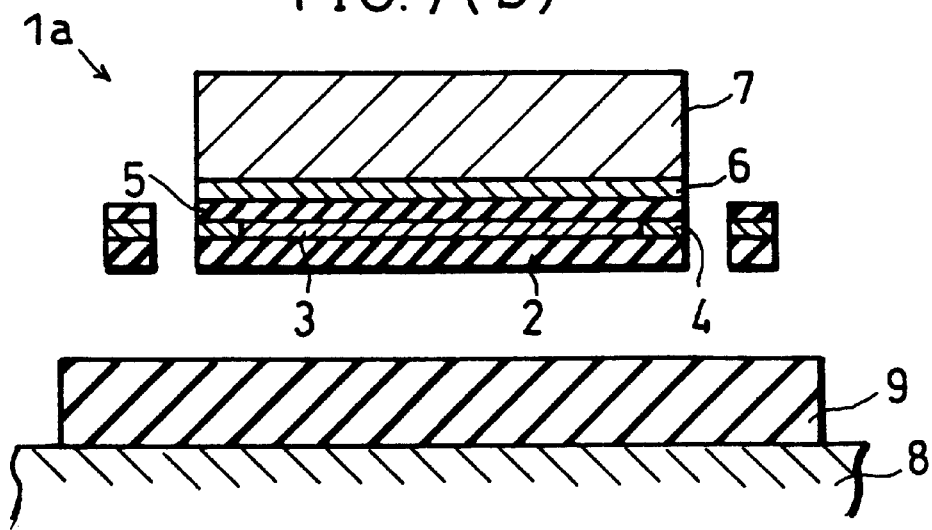
FIG. 7(b) is a cross-sectional view taken along line C—C shown in FIG. 7(a).

Specifically, as shown in FIG. 7(a), the thermal-type infrared radiation detector cell of the present embodiment includes an infrared radiation receiving section (hereinafter, will be referred to as a diaphragm structural body 1a) incorporating a diaphragm structure. As shown in FIG. 7(b), the diaphragm structure includes: a semiconductor substrate 8 on which there is provided an. integrated circuit; and a diaphragm structural body 1a electrically connected to, but spatially separated by a predetermined gap from, the semiconductor substrate 8. The substantially entire surface of the diaphragm structural body 1a serves as an infrared radiation receiving area (see FIG. 1(a)).

In the diaphragm structural body 1a, as shown in FIG. 7(b), there are provided a thermally variable resistor film 3 and metal wiring films 4 on a second silicon oxide film 2 patterned into a predetermined shape, and a third silicon oxide film 5 is formed to cover these films. As shown in FIG. 7(a), the thermally variable resistor film 3 is located at the center of the diaphragm structural body 1a, that is, in the area where projected infrared rays are received, and metal wiring films 4 are provided at least along a part of that area.

The thermally variable resistor film 3 changes its electric conductance with a change in temperature. The metal wiring films 4 are electrically connected to the thermally variable resistor film 3, and used to detect a change in a resistance value caused by a change in the electrical conductance of the thermally variable resistor film 3. The area occupied by the thermally variable resistor film 3 is almost equal to the infrared radiation receiving area.

In FIG. 7(a), metal wiring films 4 are formed on one of two pairs of opposite sides of the substantially square, thermally variable resistor film 3. The metal wiring films 4 are not limited in any particular manner in their formation pattern.

As shown in FIG. 7(b), on the third silicon oxide film 5 there is provided an infrared radiation reflector film 6 capable of completely reflecting projected infrared rays. A high refractive index film 7 is formed on the infrared radiation reflector film 6. The combined area occupied by the infrared radiation reflector film 6 and the high refractive index film 7 is also almost equal to the infrared radiation receiving area. The high refractive index film 7 satisfies equation (1), $$d = \lambda \times \{1/(4 \times n)\} \qquad (1)$$

where n and d are the refractive index and thickness of the high refractive index film 7 respectively, and λ is the wavelengths of infrared rays that the high refractive index film 7 can absorb.

Equation (1) will be described later in detail by way of examples. In FIG. 7(a), the high refractive index film 7 constituting the topmost layer and the infrared radiation reflector film 6 immediately underneath are omitted for convenience.

As shown in FIG. 7(b), an integrated circuit (not shown) is provided on the surface of the semiconductor substrate 8 separated by a predetermined distance from the diaphragm structural body 1a. On the integrated circuit there is provided a first silicon oxide film 9. Conventionally, the infrared radiation reflector film 6 is disposed on the first silicon oxide film 9. By contrast, in the present invention, as mentioned in the foregoing, the infrared radiation reflector film 6 is disposed immediately beneath the high refractive index film 7 in the diaphragm structural body 1a.

Figure 8:
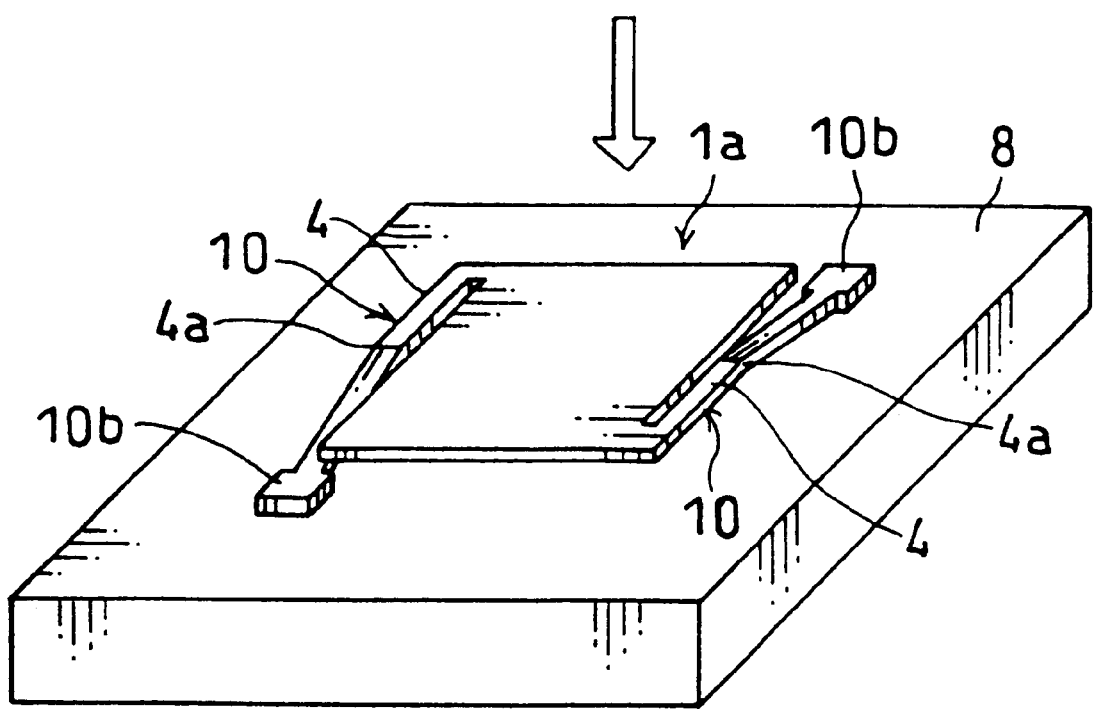
FIG. 8 is a perspective view showing the thermal-type infrared radiation detector cell shown in FIGS. 7(a) and 7(b).

As shown in FIG. 8, the metal wiring films 4 electrically connect the diaphragm structural body 1a to the semiconductor substrate 8, but spatially separate the diaphragm structural body 1a from the semiconductor substrate 8 with a predetermined distance. As shown in FIG. 7(a), each metal wiring film 4 constitutes a leg 10 for supporting the diaphragm structural body 1a, a bending section 4a holds the diaphragm structural body 1a to form a predetermined gap on the semiconductor substrate 8. Each metal wiring film 4 is electrically connected to the semiconductor substrate 8 by a substantially planar connecting electrode 10b. For convenience, FIG. 7(b) does not show how the metal wiring films 4 connect the diaphragm structural body 1a to the semiconductor substrate 8.

The thermally variable resistor film 3 is not limited in any particular manner, as long as it changes its resistance with heat. Suitably, titan oxides and vanadium oxides fulfill this requirement.

The metal wiring films 4 are electrically connected to the thermally variable resistor film 3. The metal wiring film 4 is not limited in any particular manner in terms of composition. Suitably, metals, such as titanium (Ti) and aluminum (Al), fulfill this requirement. To reduce thermal conductance, titanium is preferred because it possesses a low thermal conductivity.

The infrared radiation reflector film 6 is not limited in any particular manner in terms of composition, as long as it is capable of reflect most, more preferably almost all, incoming infrared rays. Suitably, metals, such as aluminum (Al) and titanium (Ti), fulfill this requirement.

The high refractive index film 7 is not limited in any particular manner in terms of composition; however, to reduce the thickness of the high refractive index film 7, it is preferably composed primarily of silicon (Si), germanium (Ge), or another material exhibiting a high refractive index. Here, the wording, "composed primarily of silicon or germanium" does not exclude cases where the high refractive index film 7 is composed of nothing but either silicon or germanium and of either silicon or germanium as well as other components.

Semiconductor materials, such as silicon and germanium, are low in specific heat and high in refractive index. Preferably used are those with high resistivity. Specifically, silicon has a specific heat of 0.162, a refractive index of 3.45, and a resistivity of 105 Ω·cm or higher. Germanium has a specific heat of 0.073, a refractive index of 4.09, and resistivity of 0.05 Ω·cm.

Silicon and germanium possess higher refractive indices than normally used silicon oxide ($SiO_2$) and silicon nitride (SiN). Therefore, a high refractive index film 7 with half a normal thickness serves the need when composed of either silicon or germanium.

In the thermal-type infrared radiation detector cell in accordance with the present invention, as mentioned earlier, the diaphragm structural body 1a includes an infrared radiation reflector film 6 disposed immediately beneath the high refractive index film 7 substantially satisfying equation (1). Therefore, having entered the diaphragm structural body 1a, infrared rays are absorbed by the high refractive index film 7 without leaking out of the diaphragm structural body 1a, due to the reflection and interference on the surface of the high refractive index film 7 and the surface of the infrared radiation reflector film 6.

As mentioned above, the high refractive index film 7 is composed primarily of either silicon or germanium, and its thickness, d, substantially satisfies equation (1). Under these conditions, the high refractive index film 7 has an increased refractive index, n, which increases the denominator in equation (1) and decreases the thickness d. Consequently, the thermal capacity of the diaphragm structural body 1a is greatly reduced.

If the high refractive index film 7 is composed of germanium, the relatively low specific heat of germanium, which is approximately half those of silicon oxide ($SiO_2$) and other oxides, enables further reduction in the thermal capacity of the diaphragm structural body 1a. Especially, the net thermal capacity of the diaphragm structural body 1a can be reduced to approximately ⅙ when compared to conventional diaphragm structural bodies. The high refractive index film 7 therefore exhibits short response time and produces clear images with no after image, when used in infrared radiation image capture elements.

In the present embodiment, a silicon (Si) film is used as the high refractive index film 7. Since the Si film has a refractive index n of 3.45, and is capable of detecting infrared rays having wavelengths, normally, from 8 μm to 12 μm, the average wavelength, λ, of infrared rays is specified to λ=10 μm. Substituting these values to equation (1), the thickness, d, of the high refractive index film 7 is given by:

$$d=10\times\{1/(4\times3.45)\}=0.725 \mu m(725 \text{ nm})$$

In the case of a silicon oxide ($SiO_2$) film, since n equals about 1.45, the thickness d needs to be 1.7 μm or larger. A silicon oxide film, therefore, exhibits approximately double the thermal capacity of that of the Si film having a thickness d=0.725 μm. For these reasons, the use high refractive index film 7 as in the present embodiment greatly reduces the thermal capacity of the diaphragm structural body 1a.

To calculate the net infrared radiation absorption by the thermal-type infrared radiation detector cell, a fill factor (referring, in this event, to the ratio of an effective area for the absorption of infrared radiation by the thermal-type infrared radiation detector cell) should be taken into account. The fill factor can be improved in the structure of a thermal-type infrared radiation detector cell in accordance with the present invention, since the thermal-type infrared radiation detector cell can absorb infrared rays through the entire surface of the diaphragm structural body 1a. The net In absorption by the thermal-type infrared radiation detector cell thereby reaches 52% or even higher, which is a more than 10% improvement over the net absorption of approximately 40% by conventionally structured thermal-type infrared radiation detector cells.

Since the high refractive index film 7 is formed by sputtering or another similar technique, its thickness can be controlled by adjusting the deposition time of silicon, germanium, etc. in sputtering. This adjustment is easy and requires no additional steps in the manufacturing process of the thermal-type infrared radiation detector cell, in comparison to the adjustment of spaces in conventionally structured thermal-type infrared radiation detector cells. It therefore becomes possible to ensure reducing irregularities in the infrared radiation absorption rate, that is, irregularities in sensitivity in detecting infrared rays, of diaphragm structural body 1a without adding to the complexity and cost in the manufacturing process.

Now, in reference to FIGS. 9(a) to 9(f), the following description will discuss a manufacturing method for a thermal-type infrared radiation detector cell with the structure described in the foregoing. In step 1 (hereinafter, a step will be referred as "P"), a first silicon oxide film 9 is formed to cover a semiconductor substrate 8 on which there is provided an integrated circuit. In P2, the surface of the first silicon oxide film 9 is flattened by CMP (Chemical Mechanical Polishing) or reflow by way of heat application. In P3, polyimide is applied to the entirety of the flattened surface of the first silicon oxide film 9. In P4, the polyimide is baked at, for example, about 350° C. to form a polyimide film 21.

In the present embodiment, the baked polyimide film 21 is adapted to have a thickness of about 1 $\mu$m, for example. However, the polyimide film 21 per se does not affect the absorption rate of infrared rays, and its thickness therefore can be specified freely to suit other parts of the manufacturing process of the diaphragm structure.

Figure 9A:
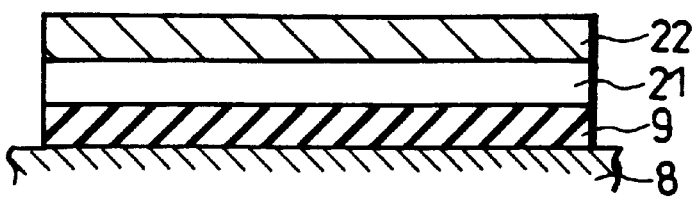
FIGS. 9(a) to (f) are explanatory drawings showing a manufacturing process of the thermal-type infrared radiation detector cell shown in FIG. 7(a) and 7(b).

Subsequently, as shown in FIG. 9(a), resist 22 is applied to the entire surface of the polyimide film 21 in P5, and etched into a desired pattern by photolithography in P6 (not shown), followed by P7 of baking at about 150° C. Here, the grounding part of a bridge is tapered. The bridge corresponds to the leg 10 shown in FIG. 7(a) and FIG. 8 and will be fabricated into a bending section 4a of a metal wiring film 4 shown in FIG. 8.

Figure 9B:
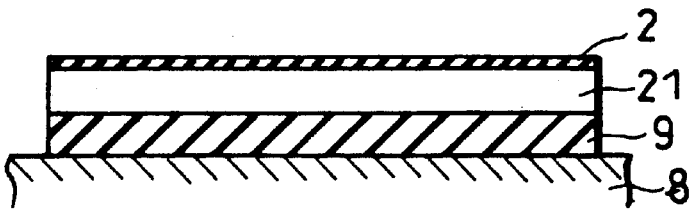

Subsequently, in P8, the entire surface of the patterned resist 22 is dry-etched, and the pattern of the resist 22 is copied to the polyimide film 21. In P9, the resist 22 is removed using a removing liquid. Further, in P10, a second silicon oxide film 2 is deposited with a thickness of about 200 nm on the entirety of the polyimide film 21 by P-CVD (Plasma-Chemical Vapor Deposition). The structure shown in FIG. 9(b) is formed at this stage.

Figure 9C:
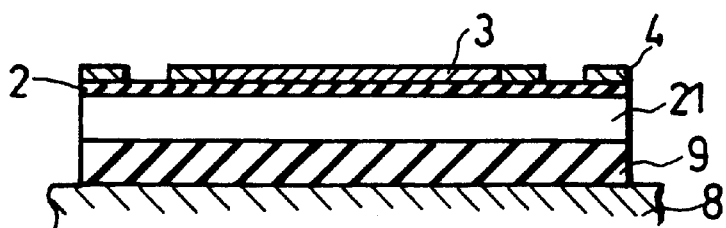
Figure 9D:
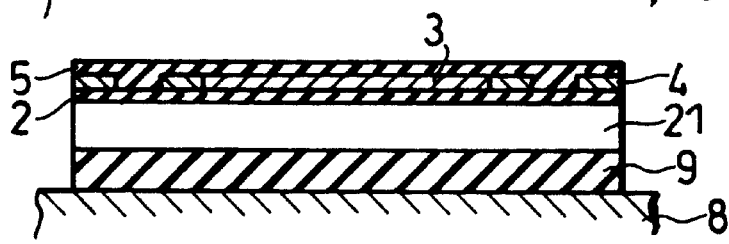

As FIG. 9(c), in P11, a thermally variable resistor film 3 and a metal wiring film 4 are formed in predetermined patterns on the second silicon oxide film 2 (see FIG. 7(a)). The thermally variable resistor film 3 is formed with a thickness of about 100 nm by sputtering titan oxide or vanadium oxide. The metal wiring film 4 is formed with a thickness of about 35 nm by sputtering titanium. In P12, to provide electrical insulation, a third silicon oxide film 5 is formed so as to cover the thermally variable resistor film 3 and the metal wiring film 4 as shown in FIG. 9(d).

Figure 9E:
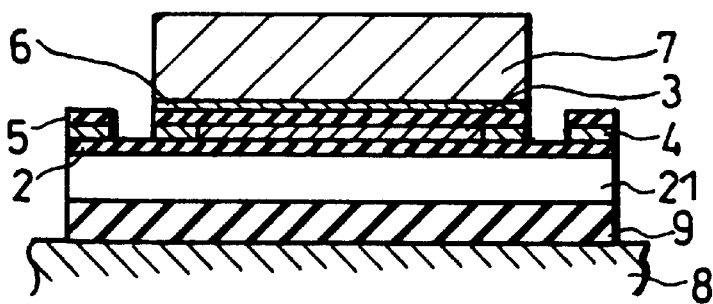

In P13, as shown in FIG. 9(e), an infrared radiation reflector film 6 with a thickness of about 100 nm is formed of aluminum or titanium by sputtering or E/B deposition so as to correspond to the thermally variable resistor film 3 and the metal wiring film 4 on the third silicon oxide film 5 in the infrared radiation receiving area. In P14, a high refractive index film 7 is formed of silicon or germanium by sputtering or another similar technique, so as to cover the infrared radiation reflector film 6. The high refractive index film 7 has a thickness of about 725 nm so as to substantially satisfy equation (1) discussed above.

Figure 9F:
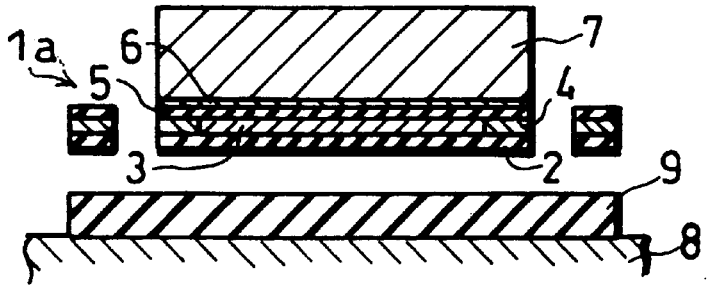

Then, in P15, the diaphragm structural body is aligned, followed by P16 of partly removing the high refractive index film 7 and the third silicon oxide film 5 by dry etching except those predetermined areas corresponding to the thermally variable resistor film 3 and the metal wiring film 4. In P17, as a last step, the polyimide film 21 is removed by dry-etching, especially, oxygen ashing technologies to complete the manufacture of the diaphragm structural body 1a as shown in FIG. 9(f).

As detailed so far, in the thermal-type infrared radiation detector cell having the structure in accordance with the present invention, the mere definition of the thickness, d, of the high refractive index film 7 structurally improves the infrared radiation absorption rate. In other words, the mere use of a high refractive index film 7 of a thickness as given by equation (1) greatly reduces the thermal capacity of the diaphragm structural body 1a. Consequently, the mere fabrication of a high refractive index film 7 of a predetermined thickness in the course of manufacture of a thermal-type infrared radiation detector cell will produce desired advantages. This will facilitate the manufacturing process and curb increase in the cost of manufacture.

Especially, in the thermal-type infrared radiation detector cell in accordance with the present invention, an infrared radiation reflector film 6 is formed beneath the high refractive index film 7 whose thickness is controlled to substantially satisfy equation (1).

As the infrared rays reflected by the infrared radiation reflector film 6 reach the surface of the high refractive index film 7 placed at the surface of the diaphragm structural body 1a, the reflection is offset by interference effects, preventing the infrared rays from leaking out of the diaphragm structural body 1a. Besides, the high refractive index film 7 and the infrared radiation reflector film 6 are placed adjacent to each other; therefore, the distance between the surface of the infrared radiation reflector film 6 and the surface of the high refractive index film 7 is determined by the thickness, d, of the high refractive index film 7 and hence is constant, causing no disturbance in interference effects.

As a result, a very high infrared radiation absorption rate is achieved relative to conventional technologies, and the infrared radiation absorption rate, i.e., the sensitivity of the thermal-type infrared radiation detector cell, is prevented from becoming irregular. Hence, excellent sensitivity is imparted to the thermal-type infrared radiation detector cell. When incorporating such a thermal-type infrared radiation detector cell, the infrared radiation image capture element incorporating does not allow occurrence of irregularities in in-plane angles, which, if any, would negatively affects image quality, and therefore boasts highly sophisticated quality.

As detailed in the foregoing, in the thermal-type infrared radiation detector cell of the present embodiment, the incident infrared rays shining downward are partly reflected by the high refractive index film 7, and partly pass through the high refractive index film 7. Having passed through the high refractive index film 7, the infrared rays are reflected by the infrared radiation reflector film 6 underneath. The infrared rays reflected by the infrared radiation reflector film 6 then take the path in reverse direction, passing through the high refractive index film 7. As having reached the upper interface of the high refractive index film 7, the infrared rays are again reflected, passed, and absorbed by the high refractive index film 7. As a result of interference effects through this multiple reflection, the energy of the infrared rays is absorbed.

Figure 17:
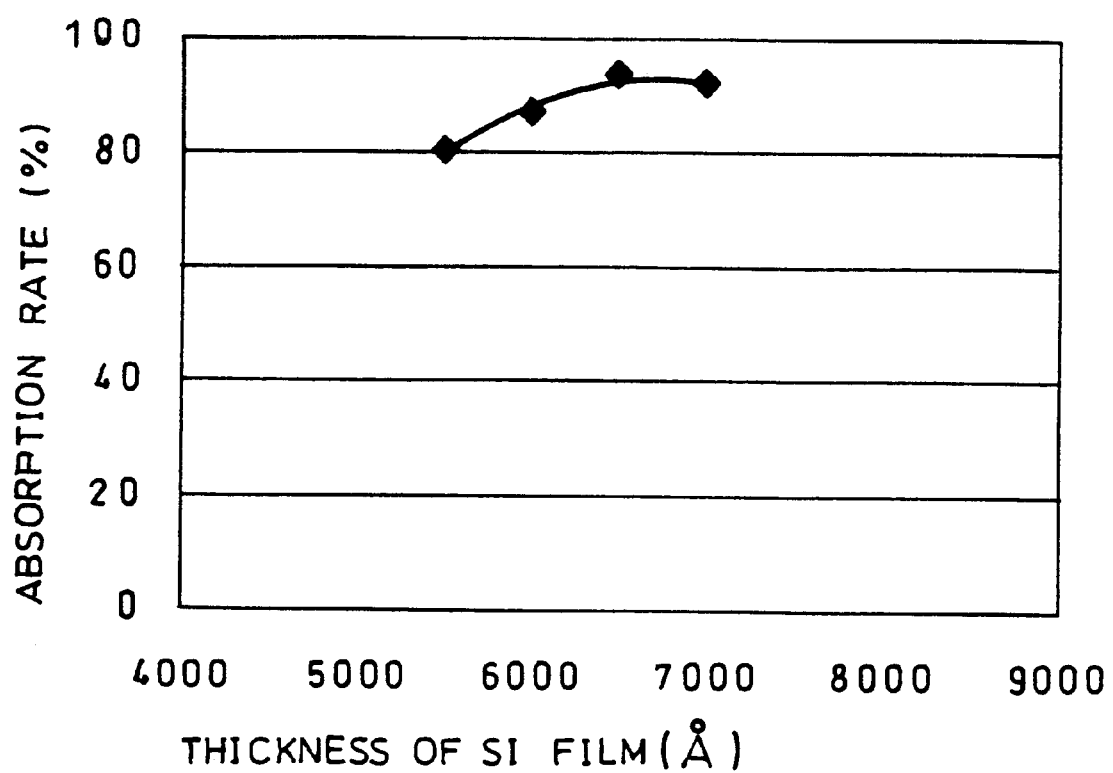
FIG. 17 is a graph showing the dependence of the infrared radiation absorption rate on a high refractive index film of the thermal-type infrared radiation detector cell including the arrangement shown in FIGS. 7(a) and 7(b) in accordance with the present invention.

FIG. 17 shows infrared radiation absorption rates plotted against thicknesses of the high refractive index film 7, that is, the dependence of the infrared radiation absorption rate on the thickness of the high refractive index film 7, in the thermal-type infrared radiation detector cell of the present embodiment. Here, the high refractive index film 7 was composed of silicon (Si), and the wavelengths of the infrared rays were from 8 μm to 12 μm. The axis of abscissas represents thicknesses of the Si film in Å, while the axis of ordinates represents absorption rates in percentage points. As clearly shown in FIG. 17, the absorption rate reached its peak of 93% at a thickness of 6500 Å.

Figure 18:
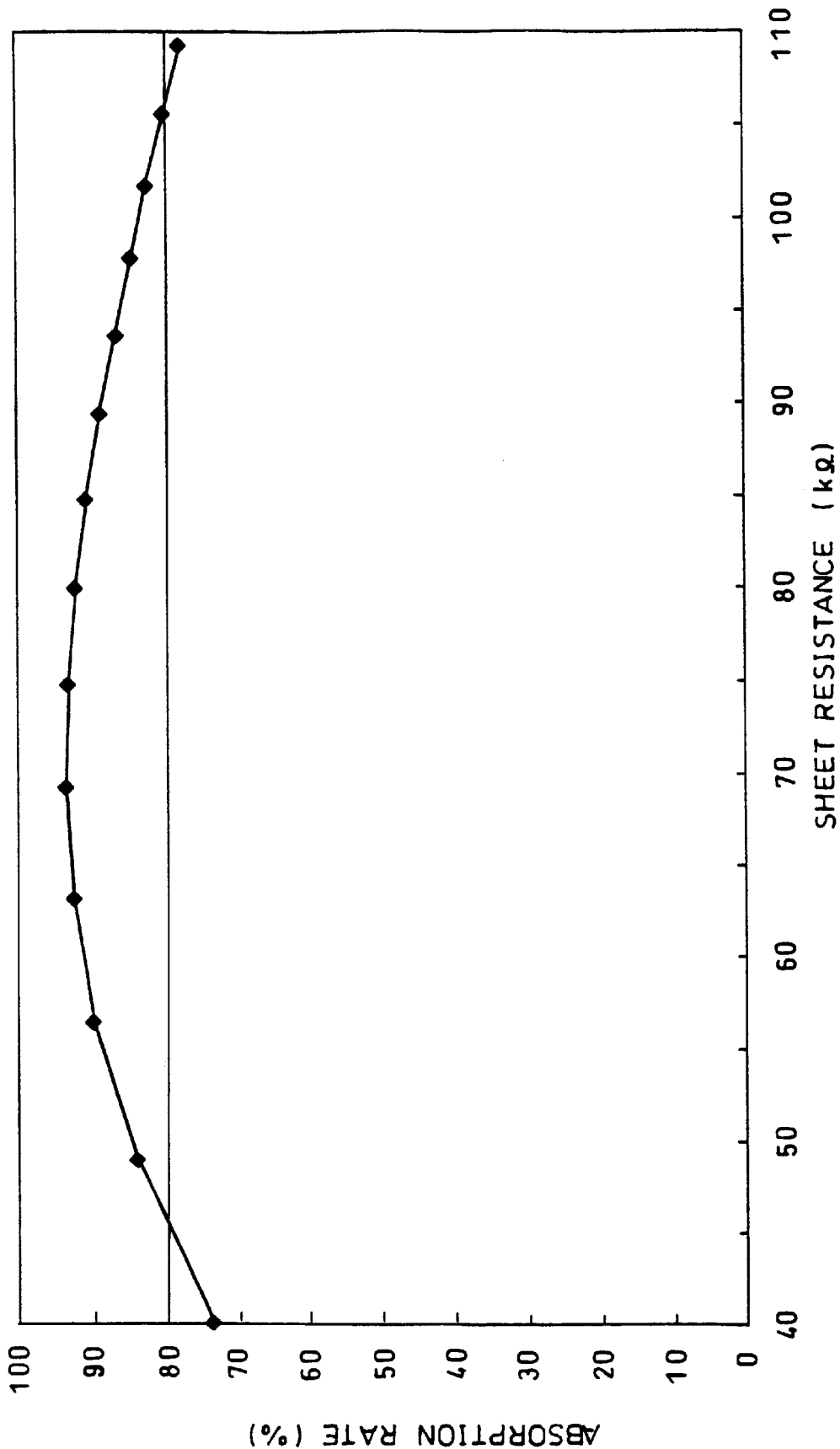
FIG. 18 is a graph showing the dependence of the infrared radiation absorption rate on the sheet resistance of the high refractive index film of the thermal-type infrared radiation detector cell including the arrangement shown in FIGS. 7(a) and 7(b) in accordance with the present invention.

The reflectance of the thermal-type infrared radiation detector cell of the present embodiment was calculated using a matrix method. Then, the absorption rate was calculated based on the results of the calculation. Results are shown in FIG. 18, from which it is understood that the absorption rate reached very high values when the high refractive index film 7 had a sheet resistance from 45 kΩ to 105 kΩ. The peak value obtained from the calculation is consistent to that of thee absorption rate, shown in FIG. 17, available with the structure including the high refractive index film 7 having a thickness of 6500 Å.

As detailed in the foregoing, the thermal-type infrared radiation detector cell of the present embodiment exhibits very high absorption rates which are much closer to theoretical values than are the rates available with conventional technologies. Besides, the thermal-type infrared radiation detector cell of the present embodiment does not require an infrared radiation absorbing film to be provided on the diaphragm structural body 1a, which is essential in conventional structures, and thereby is manufactured in less steps and at smaller cost. Further, a fewer thin films are required in the diaphragm structural body 1a, improving on the structural stability of the diaphragm structural body 1a.

As discussed so far, a thermal-type infrared radiation detector cell in accordance with the present invention is a thermal-type infrared radiation detector cell incorporating a diaphragm structure including a high refractive index film as an infrared radiation absorption layer, wherein the diaphragm structure further includes an infrared radiation reflector film provided beneath the high refractive index film, the thickness, d, of the high refractive index film being given approximately by $$d = \lambda \times \{1/(4 \times n)\}$$

where n is the refractive index of the high refractive index film, and λ is the wavelengths of infrared rays absorbed.

According to the arrangement, the employment of the diaphragm structure reduces thermal conductance, and the equation is substantially satisfied inside the diaphragm structure. Therefore, the diaphragm structure does not allow Joule heat produced by infrared rays to flow, and the reflection of infrared rays by the surface of the diaphragm structure is offset by interference effects. Therefore, infrared rays do not leak out of the diaphragm structure. Besides, the distance between the high refractive index film and a reflector film, which plays an important role in interference effects, is controllable through adjustment of the thickness of the high refractive index film; therefore, the distance is constant.

As a result, a very high infrared radiation absorption rate is achieved relative to conventional technologies, and the infrared radiation absorption rate, i.e., the sensitivity of the thermal-type infrared radiation detector cell, is prevented from becoming irregular. Besides, the use of a high refractive index film allows for a great reduction in the thickness of the diaphragm structure, effectively preventing increase in the thermal capacity of the thermal-type infrared radiation detector cell. That is, the diaphragm structure has a greatly reduced thermal capacity, compared to conventional technologies. As a result, the thermal-type infrared radiation detector cell exhibits excellent sensitivity and quick response, compared to conventional technologies.

Further, according to the arrangement, the thermal-type infrared radiation detector cell requires no infrared radiation absorbing film and is capable of improving the infrared radiation absorption rate, structurally, by controlling only the thickness of the high refractive index film. The omission of the infrared radiation absorbing film avoids an increase in the number of steps required in the manufacturing process, i.e., facilitates the manufacturing process, and also avoids an increase in the manufacturing cost, i.e., reduces the manufacturing cost. Therefore, the thermal-type infrared radiation detector cell is manufactured with excellent performance at lower cost.

A thermal-type infrared radiation detector cell in accordance with the present invention incorporates all the foregoing arrangement and is preferably such that the diaphragm structure further includes: a thermally variable resistor film changing its electric conductance with temperature variations; and metal wiring films electrically connected to the thermally variable resistor film.

According to the arrangement, the thermally variable resistor film changes its electric conductance, hence, its resistance, with an upward variation in temperature caused by the infrared radiation absorption by the high refractive index film. As a result, the infrared rays absorbed by the high refractive index film are converted into electric signals and transmitted through the metal wiring films electrically connected to the thermally variable resistor film for efficient detection. The thermal-type infrared radiation detector cell therefore more surely detects infrared rays.

A thermal-type infrared radiation detector cell in accordance with the present invention incorporates all the foregoing arrangement and is preferably such that an insulating layer is interposed between the infrared radiation reflector film and the thermally variable resistor film.

According to the arrangement, there is provided an insulating layer between the infrared radiation reflector film and the thermally variable resistor film; therefore, the thermal energy for heating up the thermally variable resistor film does not leak via the infrared radiation reflector film with a high thermal conductance. This enables efficient heating of the thermally variable resistor film, and thus further improves the sensitivity of the thermal-type infrared radiation detector cell.

A thermal-type infrared radiation detector cell in accordance with the present invention incorporates all the foregoing arrangement and is preferably such that the high refractive index film is primarily composed of silicon or germanium.

According to the arrangement, the high refractive index film is primarily composed of silicon or germanium; therefore, the diaphragm structure has a greatly reduced thermal capacity and improves the response time of the thermal-type infrared radiation detector cell to incident infrared rays. Besides, if silicon or germanium is used to form the high refractive index film, its thickness is readily controllable by simply depositing the material, which facilitates the manufacturing process and reduces the manufacturing cost.

[Embodiment 5]

Referring to drawings, the following description will discuss another embodiment in accordance with the present invention. The embodiment by no means constitutes a limitation on the scope of the present invention. Here, for convenience, members of the present embodiment that have the same arrangement and function as members of any one of the previous embodiments, and that are mentioned in that embodiment are indicated by the same reference numerals and description thereof is omitted.

In the present embodiment, the "surface direction" refers to a direction which is parallel to the surface of a film, such as an infrared radiation reflector film, or a direction in which the surface expands. Meanwhile, the "thickness direction" refers to a direction which is perpendicular to the surface (normal to the surface).

Figure 10:
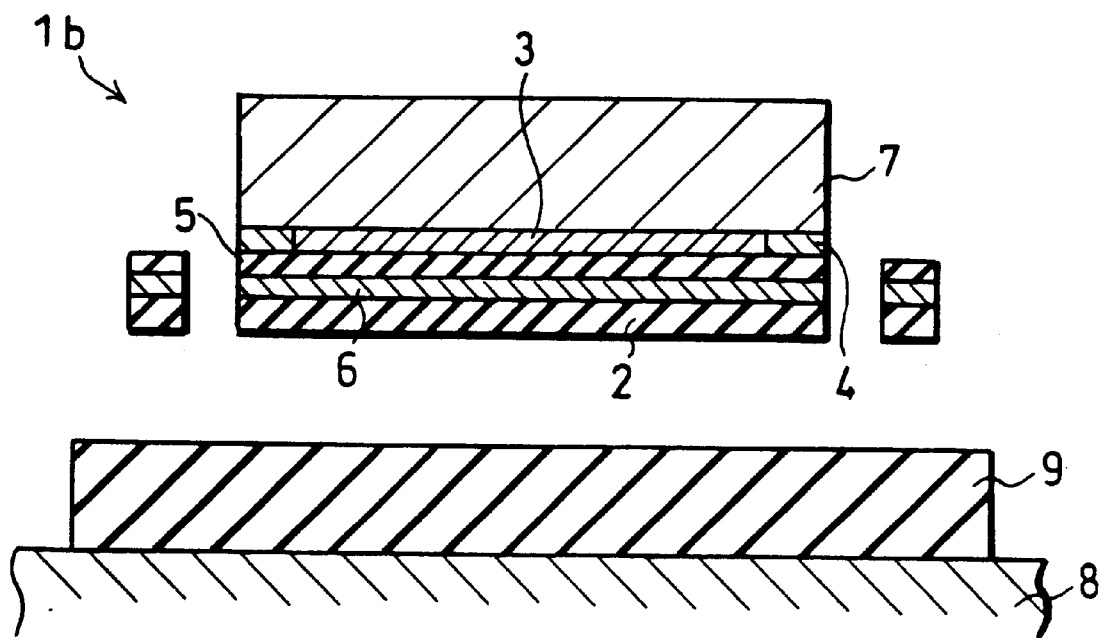
FIG. 10 is a cross-sectional view schematically showing the structure of a thermal-type infrared radiation detector cell of another embodiment in accordance with the present invention.

A thermal-type infrared radiation detector cell of the present embodiment includes a diaphragm structural body 1b in which, as shown in FIG. 10, there are provided an infrared radiation reflector film 6 on a second silicon oxide film 2 patterned in a predetermined shape, and a third silicon oxide film (insulating layer) 5 on the infrared radiation reflector film 6. The third silicon oxide film 5 has substantially the same shape as the second silicon oxide film 2. Further, disposed on the third silicon oxide film 5, a thermally variable resistor film 3 and metal wiring films 4 are fabricated into predetermined shapes similarly to embodiment 1 (see FIG. 7(a)), and electrically connected to each other.

A high refractive index film 7 is provided on the thermally variable resistor film 3 and the metal wiring films 4. The thickness of the high refractive index film 7 is specified according to equation (1) discussed in embodiment 1.

As detailed in embodiment 1, the infrared radiation reflector film 6 is composed of a metal, primarily of titanium (Ti) or aluminum (Al), and therefore has a higher thermal conductivity than the second silicon oxide film 2 and the third silicon oxide film 5 which serve as an insulating film.

As explained in embodiment 1, infrared rays entering the diaphragm structural body 1b are absorbed by opposite phase interference and thus converted into heat at the surface of the high refractive index film 7. The heat is distributed throughout the diaphragm structural body 1b, heating the thermally variable resistor film 3. A resultant change in the resistance of the thermally variable resistor film 3 is detected by the metal wiring films 4 as an output.

In the diaphragm structural body 1b in the thermal-type infrared radiation detector cell of the present embodiment, the infrared radiation reflector film 6 with a high thermal conductivity is disposed below the thermally variable resistor film 3 with the intervening third silicon oxide film 5, instead of directly contacting the thermally variable resistor film 3.

In other words, in the diaphragm structural body 1b of the present embodiment, the third silicon oxide film 5 is interposed as an insulating layer between the infrared radiation reflector film 6 and the thermally variable resistor film 3. Further, at least the thermally variable resistor film 3 intervenes between the high refractive index film 7 and the infrared radiation reflector film 6. In addition, an insulating layer (the third silicon oxide film 5) intervenes between the high refractive index film 7 and the infrared radiation reflector film 6.

Therefore, the heat produced at the surface of the high refractive index film 7 and transferred to the thermally variable resistor film 3 is prevented from leaking to the infrared radiation reflector film 6 in surface directions, efficiently heating the thermally variable resistor film 3. The thermal-type infrared radiation detector cell in accordance with the present invention hence exhibits improved sensitivity.

As detailed in the above, the thermal-type infrared radiation detector cell in accordance with the present invention incorporates all the arrangement detailed in embodiment 4 and is preferably such that at least the thermally variable resistor film is provided between the high refractive index film and the infrared radiation reflector film.

According to this arrangement, a thermally variable resistor film is placed closer to a high refractive index film producing heat by means of infrared radiation absorption than according to previous arrangements; therefore, the heat produced in the high refractive index film is prevented from leaking to the infrared radiation reflector film from the thermally variable resistor film. This enables effective heating of the thermally variable resistor film and hence imparts improved sensitivity to the thermal-type infrared radiation detector cell.

The thermal-type infrared radiation detector cell in accordance with the present invention incorporates all this arrangement and is preferably such that there is provided an insulating layer between the high refractive index film and the infrared radiation reflector film.

According to the arrangement, the high refractive index film is insulated from the infrared radiation reflector film. A sense current does not branch out from the thermally variable resistor film to the high refractive index film. This allows efficient detection of a change in the resistance of the thermally variable resistor film due to infrared radiation absorption, and hence imparts improved sensitivity to the thermal-type infrared radiation detector cell.

Besides, according to the arrangement, the prevention of the sense current from branching out to the high refractive index film enables the thermally variable resistor film to exhibit increased resistivity and thus increased change in resistance in response to thermal input. As a result, the thermal-type infrared radiation detector cell exhibits improved sensitivity. The successful prevention of sense current from branching out to the high refractive index film further allows reduction in the resistivity of the high refractive index film. With reduced resistivity, the high refractive index film can have an increased refractive index, and hence a reduced thickness. This imparts improved time resolution to the thermal-type infrared radiation detector cell.

[Embodiment 6]

Referring to drawings, the following description will discuss another embodiment in accordance with the present invention. The embodiment by no means constitutes a limitation on the scope of the present invention. Here, for convenience, members of the present embodiment that have the same arrangement and function as members of embodiment 4 or 5, and that are mentioned in embodiment 4 or 5 are indicated by the same reference numerals and description thereof is omitted.

Figure 11:
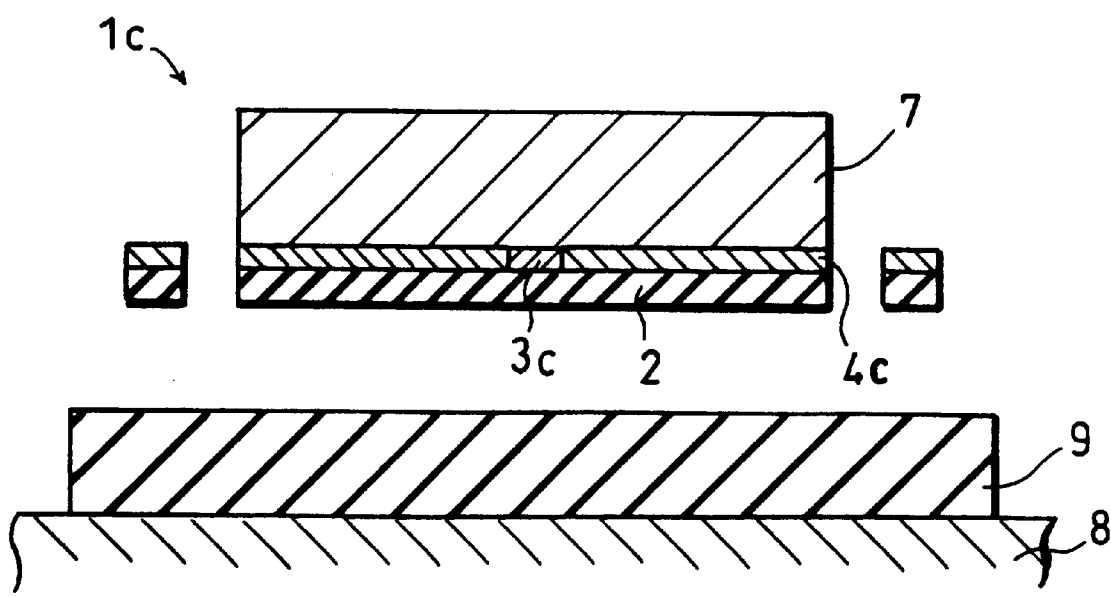
FIG. 11 is a cross-sectional view schematically showing the structure of a thermal-type infrared radiation detector cell of another embodiment in accordance with the present invention.

A thermal-type infrared radiation detector cell of the present embodiment includes a diaphragm structural body 1c in which, as shown in FIG. 11, there are provided a thermally variable resistor film 3c and metal wiring films 4c in predetermined shapes directly on a second silicon oxide film 2 patterned in a predetermined shape.

The metal wiring films 4c are deposited in the same manner, using the same material, as the metal wiring film 4 in embodiments 4 and 5. However, the metal wiring films 4c have a different shape from the metal wiring films 4. Specifically, as shown in FIG. 11, the metal wiring films 4c are formed on the second silicon oxide film 2 in such a shape as to cover a substantial entirety of surface of the diaphragm structural body 1c.

The thermally variable resistor film 3c is also deposited in the same manner, using the same material, as the thermally variable resistor film 3 in embodiments 4 and 5, and placed in the center of the diaphragm structural body 1c similarly to the thermally variable resistor film 3 being placed in the center of the diaphragm structural body 1 in embodiments 4 and 5. However, similarly to the metal wiring films 4, the thermally variable resistor film 3c has a different shape from the thermally variable resistor film 3. Specifically, as shown in FIG. 11, the thermally variable resistor film 3c has a long, narrow shape and is flanked on its two sides by the metal wiring films 4c. The metal wiring films 4c are electrically connected to the thermally variable resistor film 3c as in embodiments 4 and 5.

In the present embodiment, a structure is explained in which the thermally variable resistor film is flanked by the metal wiring films 4c. Alternatively, the metal wiring films 4c may overlap the thermally variable resistor film 3c, or conversely, the thermally variable resistor film 3c may overlap the metal wiring films 4c.

A high refractive index film 7 is provided on the thermally variable resistor film 3c and the metal wiring films 4c. The thickness of the high refractive index film 7 is specified according to equation (1) discussed in embodiment 4 as was in embodiment 5.

In the thermal-type infrared radiation detector cell of the present embodiment, as detailed in the above, the metal wiring films 4c are formed to cover almost all the surface of the diaphragm structural body 1c. Accordingly, in practical use, the metal wiring films 4c double as a conductor layer for detecting a change in the resistance of the thermally variable resistor film 3c due to heating and as an infrared radiation reflector film for reflecting incident infrared rays entering the diaphragm structural body 1c (the infrared radiation reflector film 6 in FIG. 7(b) and FIG. 10).

As a result, the thermal-type infrared radiation detector cell of the present embodiment can dispense with the infrared radiation reflector film in the diaphragm structural body 1c and thus the steps to deposit the infrared radiation reflector film and fabricate it into a predetermined shape. This simplifies the arrangement and further reduces the manufacturing cost of the thermal-type infrared radiation detector cell in accordance with the present invention.

As detailed in the above, a thermal-type infrared radiation detector cell in accordance with the present invention incorporates all the arrangement discussed in embodiment 1 and is preferably such that the infrared radiation reflector film doubles as metal wiring films.

According to the arrangement, the metal wiring films double as an infrared radiation reflector film; therefore, the steps to deposit the infrared radiation reflector film and fabricate it into a predetermined shape can be omitted. This simplifies the arrangement and further reduces the manufacturing cost of the thermal-type infrared radiation detector cell.

[Embodiment 7]

Referring to drawings, the following description will discuss another embodiment in accordance with the present invention. The embodiment by no means constitutes a limitation on the scope of the present invention. Here, for convenience, members of the present embodiment that have the same arrangement and function as members of any one of embodiments 4 through 6, and that are mentioned in that embodiment are indicated by the same reference numerals and description thereof is omitted.

Figure 12:
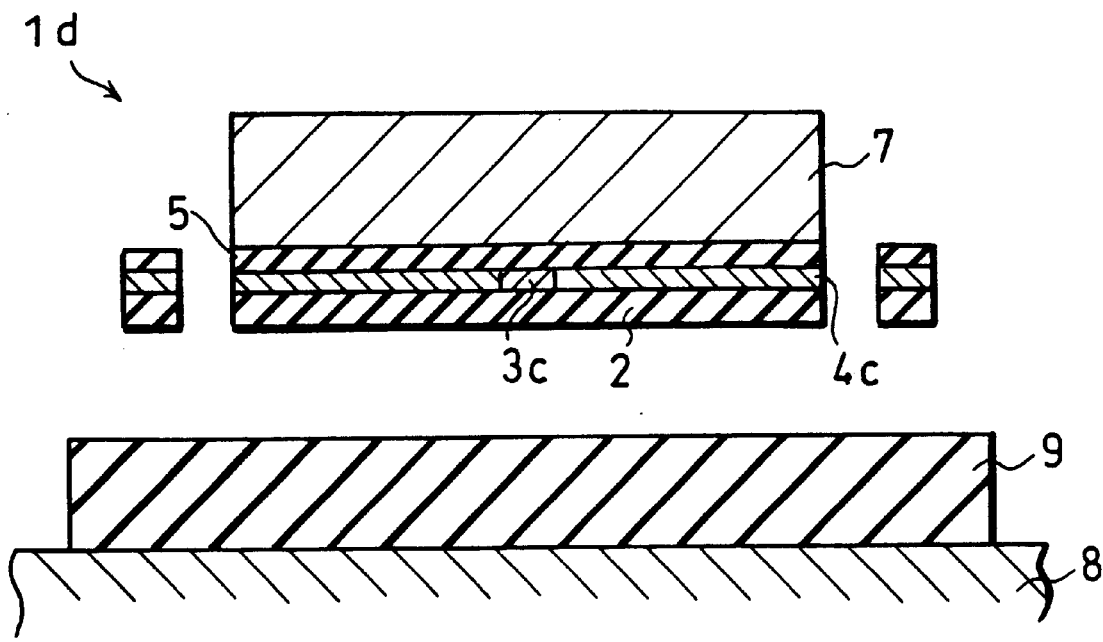
FIG. 12 is a cross-sectional view schematically showing the structure of a thermal-type infrared radiation detector cell of a further embodiment in accordance with the present invention.

A thermal-type infrared radiation detector cell of the present embodiment includes a diaphragm structural body 1d in which, as shown in FIG. 12, there are provided a thermally variable resistor film 3c and metal wiring films 4c in predetermined shapes directly on a second silicon oxide film 2 patterned in a predetermined shape as in embodiment 5. Accordingly, the metal wiring films 4c have such a shape as to cover a substantial entirety of the surface of the diaphragm structural body 1d, whereas the thermally variable resistor film 3c has a long, narrow shape and is flanked on its two sides by the metal wiring films 4c in the middle of the diaphragm structural body 1d. The metal wiring films 4c are electrically connected to the thermally variable resistor film 3c as in embodiments 4 through 6.

In the present embodiment, a structure is explained in which the thermally variable resistor film is flanked by the metal wiring films 4c. Alternatively, the metal wiring films 4c may overlap the thermally variable resistor film 3c, or conversely, the thermally variable resistor film 3c may overlap the metal wiring films 4c.

A third silicon oxide film 5 is provided on the metal wiring films 4c and the thermally variable resistor film 3c in substantially the same shape as the second silicon oxide film 2. On the third silicon oxide film 5, there is provided a high refractive index film 7 in a predetermined shape.

In the present embodiment, the thickness of the high refractive index film 7 is specified to a predetermined value as in embodiments 4 through 6. It should be noted however that the thickness specified according to equation (1) discussed in embodiment 4 is a combined thickness of the high refractive index film 7 and the third silicon oxide film 5. In other words, in the present embodiment, the combined thickness of the third silicon oxide film 5 and the high refractive index film 7 is specified to ¼n times the wavelengths, λ, with the refractive indices of the third silicon oxide film 5 and the high refractive index film 7 being taken into account.

As detailed in the above, the thermal-type infrared radiation detector cell of the present embodiment incorporates all the arrangement discussed in embodiment 6 and is preferably such that there is provided a third silicon oxide film 5 for electrically insulating the metal wiring films 4c from the high refractive index film 7. Therefore, a sense current (referring to current running through the thermally variable resistor film 3c to detect a change in the resistance of the thermally variable resistor film 3c) does not branch out from the metal wiring films 4c to the high refractive index film 7. This allows efficient detection of a change in the resistance of the thermally variable resistor film 3c by the metal wiring films 4c and thus imparts improved sensitivity to the thermal-type infrared radiation detector cell.

Besides, the prevention of the sense current from branching out from the metal wiring films 4c to the high refractive index film 7 enables the thermally variable resistor film 3c to exhibit increased resistivity and thus increased the change, α, in the resistance of the thermally variable resistor film 3c in response to thermal input. The successful prevention of sense current from branching out to the high refractive index film 7 further allows reduction in the resistivity of the high refractive index film 7. With reduced resistivity, the high refractive index film 7 can have an increased refractive index, and hence a reduced thickness. This imparts a reduced thermal capacity to the thermal-type infrared radiation detector cell.

Normally, it takes some time to measure the resistance of the thermal-type infrared radiation detector cell. The time required for a measurement becomes longer with an increasingly large thermal capacity of the diaphragm. Therefore, by reducing the thermal capacity of the thermal-type infrared radiation detector cell as in the present embodiment, the time constant in infrared radiation detection becomes smaller (it takes less time to measure). Thus, time resolution of the thermal-type infrared radiation detector cell improves. similarly to embodiment 6, in the present embodiment, the metal wiring films 4c may also overlap the thermally variable resistor film 3c, or conversely, the thermally variable resistor film 3c may overlap the metal wiring films 4c.

As detailed in the above, a thermal-type infrared radiation detector cell in accordance with the present invention incorporates all the arrangement discussed in embodiment 6 and is preferably such that there is provided an insulating layer between the high refractive index film and the infrared radiation reflector film.

According to the arrangement, the high refractive index film is insulated from the infrared radiation reflector film; therefore, sense current does not branch out from the thermally variable resistor film to the high refractive index film. This allows efficient detection of a change in the resistance of the thermally variable resistor film and thus imparts improved sensitivity to the thermal-type infrared radiation detector cell.

The prevention of the sense current from branching out to the high refractive index film enables the thermally variable resistor film to exhibit increased resistivity and thus increased change in resistance in response to thermal input. As a result, the thermal-type infrared radiation detector cell exhibits improved sensitivity.

The successful prevention of sense current from branching out to the high refractive index film further allows reduction in the resistivity of the high refractive index film. With reduced resistivity, the high refractive index film can exhibit an increased refractive index, and hence a reduced thickness. This imparts improved time resolution to the thermal-type infrared radiation detector cell.

[Embodiment 8]

Referring to drawings, the following description will discuss another embodiment in accordance with the present invention. The embodiment by no means constitutes a limitation on the scope of the present invention. Here, for convenience, members of the present embodiment that have the same arrangement and function as members of any one of embodiments 4 through 7, and that are mentioned in that embodiment are indicated by the same reference numerals and description thereof is omitted.

Figure 13:
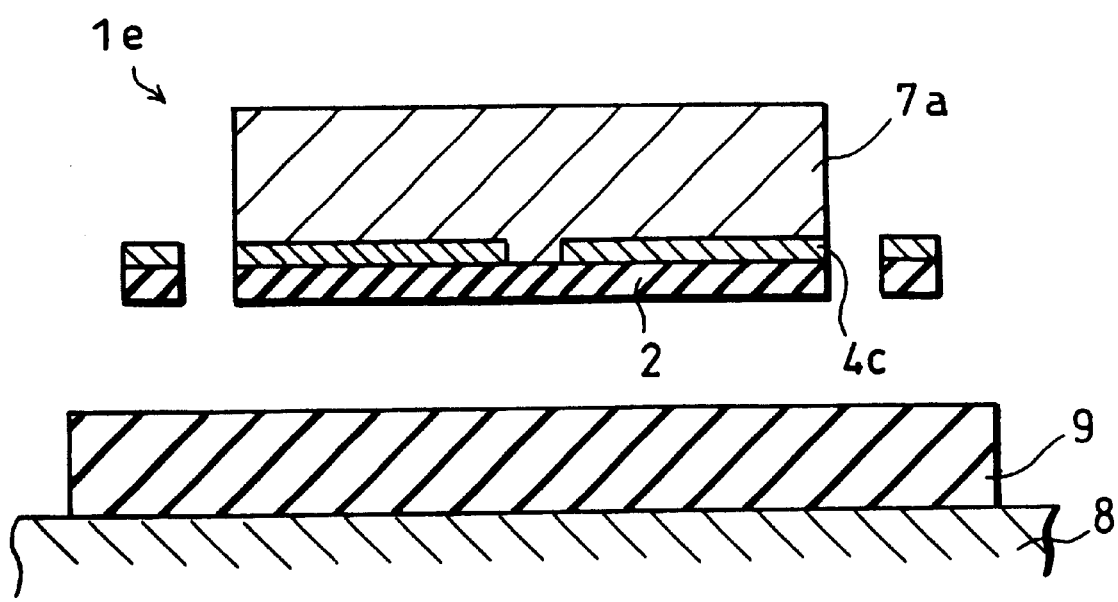
FIG. 13 is a cross-sectional view schematically showing the structure of a thermal-type infrared radiation detector cell of still another embodiment in accordance with the present invention.

A thermal-type infrared radiation detector cell of the present embodiment includes a diaphragm structural body 1e in which, as shown in FIG. 13, there is provided a metal wiring films 4c in a predetermined shape directly on a second silicon oxide film 2 patterned in a predetermined shape as in embodiments 6 and 7. The metal wiring films 4c have such a shape as to cover a substantial entirety of the surface of the diaphragm structural body 1e. However, no thermally variable resistor film 3c is provided in the middle of the diaphragm structural body 1e.

A high refractive index film 7a is provided on the metal wiring films 4c similarly to embodiment 6 so as to be partly in direct contact with the second silicon oxide film 2. Specifically, as shown in FIG. 13, the high refractive index film 7a expands into the place where in embodiment 6 the thermally variable resistor film 3c was provided, replacing the thermally variable resistor film 3c.

In other words, in the diaphragm structural body 1e of the present embodiment, the metal wiring films 4c taking a dual role as an infrared radiation reflector film are formed on the second silicon oxide film 2 of a predetermined shape, so as to cover almost all the diaphragm structural body 1e except its middle. The high refractive index film 7a formed on the metal wiring films 4c so that its middle part directly contacts the second silicon oxide film 2. The high refractive index film 7 is electrically connected to the metal wiring films 4c.

The high refractive index film 7a of the present embodiment is primarily composed of silicon (Si) as the high refractive index films 7 of embodiments 4 through 7. However, in the present embodiment, the high refractive index film 7a is adapted to double as a thermally variable resistor film 3, by controlling the carrier density in the high refractive index film 7a primarily composed of silicon and thereby adjusting the resistivity and thermally variable resistance of the high refractive index film 7a.

Specifically, the high refractive index film 7a is deposited by sputtering as in embodiment 4, whilst a difference lies where in the present embodiment the carrier density is controlled in the high refractive index film 7a during the sputtering operation through the control of the amounts of dopants (doping materials) with which the sputtering target is doped. Dopants with which the sputtering target is doped are not limited in any particular manner. Typical examples of the dopants include boron (B) and phosphorus (P), which are used in semiconductor manufacturing processes.

As discussed in the foregoing, the thermal-type infrared radiation detector cell of the present embodiment incorporates all the arrangement discussed in embodiment 6 and is such that there is provided no thermally variable resistor film 3c, and that a high refractive index film 7a is formed so as to double as a thermally variable resistor film 3c. Therefore, the diaphragm structural body 1e in the thermal-type infrared radiation detector cell of the present embodiment does not require the provision of a thermally variable resistor film 3c, which greatly simplifies the manufacturing process of the thermal-type infrared radiation detector cell. As a result, the thermal-type infrared radiation detector cell can be manufactured at a reduced cost.

As detailed in the above, another thermal-type infrared radiation detector cell in accordance with the present invention incorporates all the arrangement discussed in embodiment 7 and is such that the high refractive index film doubles as a thermally variable resistor film.

According to the arrangement, the high refractive index film doubles as a thermally variable resistor film; therefore, the steps to deposit the infrared radiation reflector film and fabricate it into a predetermined shape can be omitted. This simplifies the arrangement and further reduces the manufacturing cost of the thermal-type infrared radiation detector cell.

A thermal-type infrared radiation detector cell in accordance with the present invention incorporates all the arrangement and is such that the high refractive index film is primarily composed of silicon.

According to the arrangement, silicon is used as a major component of the high refractive index film; therefore, the diaphragm structure has a greatly reduced thermal capacity, and improves the response to incident infrared rays. Besides, if silicon is used to form the high refractive index film, its thickness is readily controllable by simply depositing the material, as well as its resistivity and thermally variable resistance are adjustable by controlling the amounts of dopants and thus controlling the carrier density in the high refractive index film.

[Embodiment 9]

Referring to drawings, the following description will discuss another embodiment in accordance with the present invention. The embodiment by no means constitutes a limitation on the scope of the present invention. Here, for convenience, members of the present embodiment that have the same arrangement and function as members of any one of embodiments 4 through 8, and that are mentioned in that embodiment are indicated by the same reference numerals and description thereof is omitted.

A thermal-type infrared radiation detector cell of the present embodiment has the same arrangement as in embodiments 4 through 8, in which there are provided: a diaphragm structural body 1f for detecting infrared radiation; a semiconductor substrate 8 electrically connected to the diaphragm structural body 1f; and legs (supporting members) 10 for supporting the diaphragm structural body 1f above the semiconductor substrate 8 in such a manner to ensure a predetermined gap between the semiconductor substrate 8 and the diaphragm structural body 1f (see FIG. 7(a) and FIG. 8).

Figure 14:
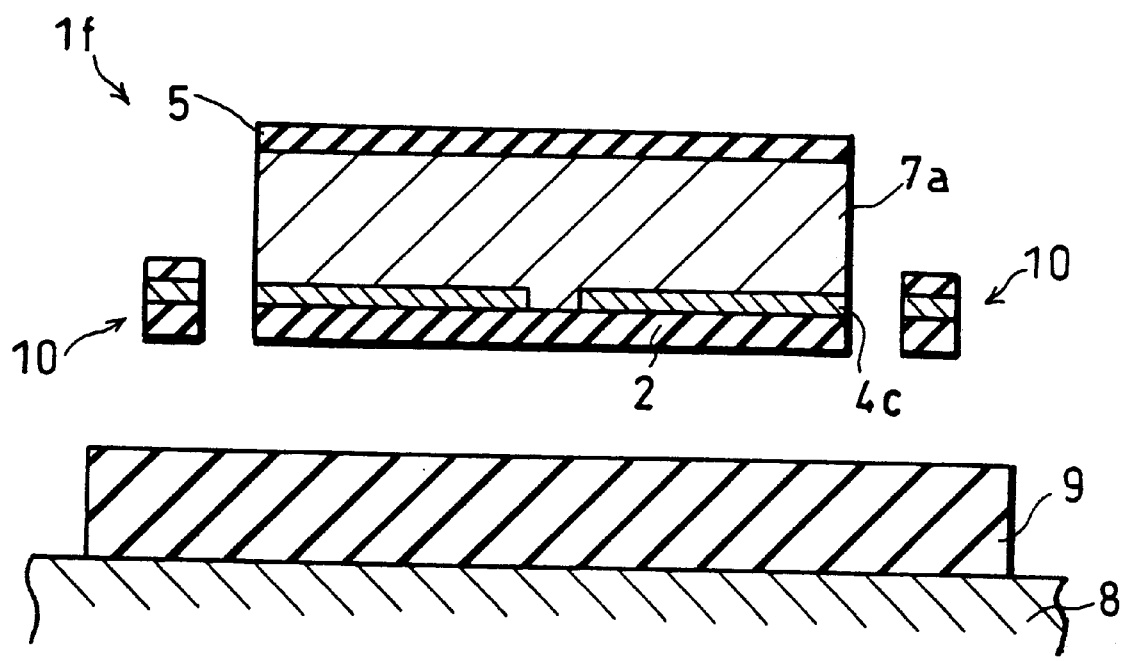
FIG. 14 is a cross-sectional view schematically showing the structure of a thermal-type infrared radiation detector cell of another embodiment in accordance with the present invention.
Figure 15A:
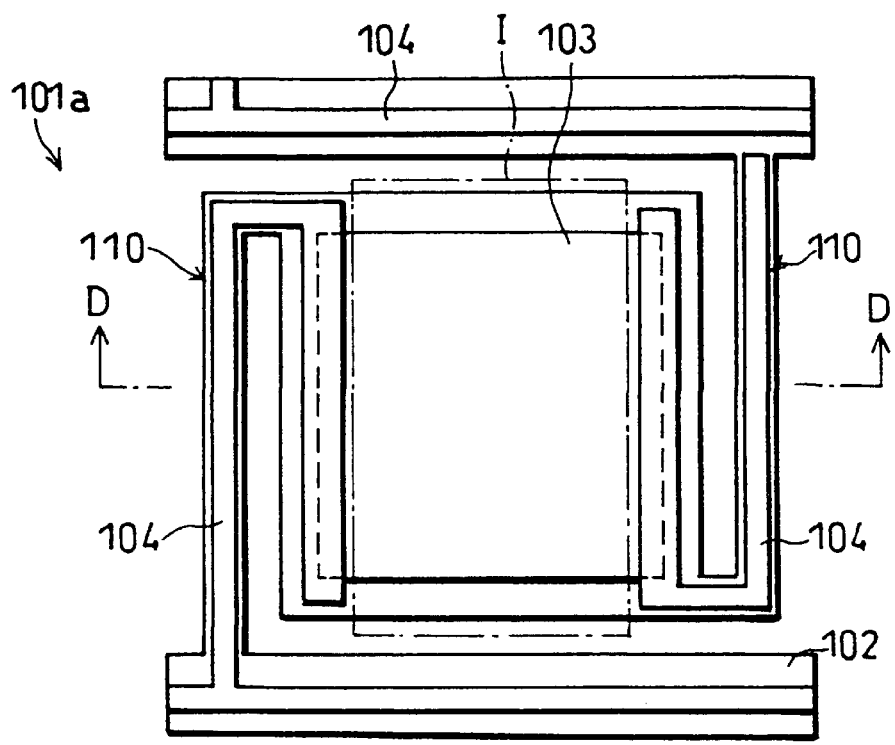
FIG. 15(a) is a plan view showing a conventional thermal-type infrared radiation detector cell as an example.
Figure 15B:
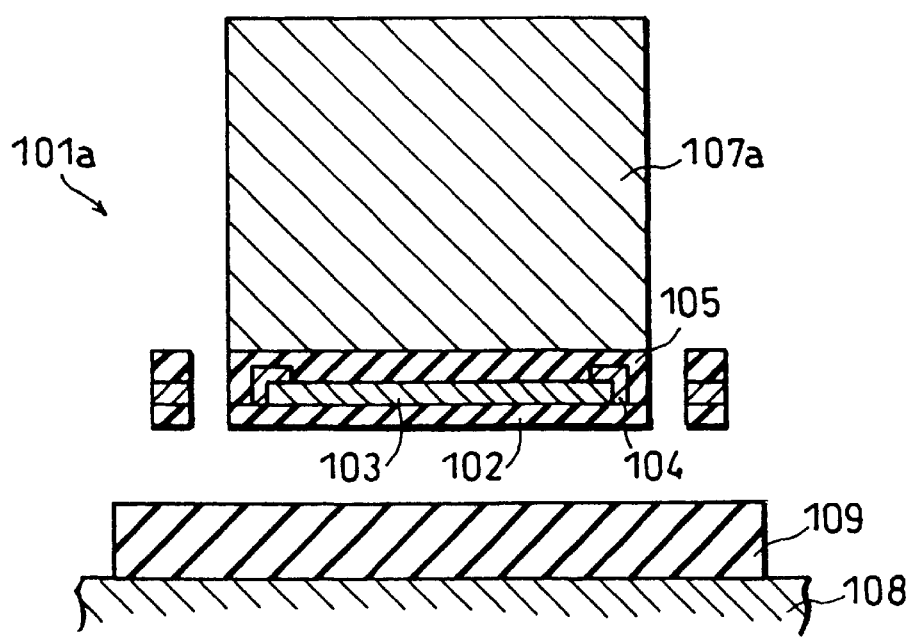
FIG. 15(b) is a cross-sectional view taken along line D—D shown in FIG. 15(a).

In the diaphragm structural body 1f, as shown in FIG. 14, a third silicon oxide film 5 is provided so as to cover the entirety of the surface of the structure discussed in embodiment 8 (the diaphragm structural body 1e shown in FIG. 13).

In other words, the diaphragm structural body 1f of the present embodiment is such that in the diaphragm structural body 1e of embodiment 8, the third silicon oxide film 5 is provided so as to cover the entirety of the surface of the high refractive index film 7a, as well as the metal wiring films 4 on bridges (leg 10 in FIG. 7(a) and FIG. 8).

In this manner, the thermal-type infrared radiation detector cell of the present embodiment includes the structure of embodiment 8 and a third silicon oxide film 5 covering the structure. Therefore, the third silicon oxide film 5 provides protection to the metal wiring films 4 on the bridge by covering it, so as to prevent degradation of the metal wiring films 4 due to direct exposure to environment. This imparts improved environmental insusceptibility to the thermal-type infrared radiation detector cell.

Further, the third silicon oxide film 5 covering the entire surface of the diaphragm structural body 1f as well as of the bridges as shown in FIG. 14 provides protection to the high refractive index film 7a as well as to the metal wiring films 4. This imparts further improved environmental insusceptibility to the thermal-type infrared radiation detector cell. If the third silicon oxide film 5 also cover the surface of the diaphragm structural body 1f, the combined thickness of the third silicon oxide film 5 and the high refractive index film 7 is specified to about ¼n times the wavelengths, λ, of the infrared rays passing through the third silicon oxide film 5 and the high refractive index film 7 according to equation (1) detailed in embodiment 1.

In the present embodiment, the third silicon oxide film 5 cover the entire surface of the diaphragm structural body 1f as shown in FIG. 14; however, this is by no means intended to restrict the scope of the invention. For example, the third silicon oxide film 5 may be provided to only cover the bridges.

Further, in the present embodiment, the third silicon oxide film 5 is applied on the structure of embodiment 8; however, this is by no means intended to restrict the scope of the invention. For example, the third silicon oxide film 5 may be applied to the structure of embodiment 6.

As detailed in the above, in the thermal-type d infrared radiation detector cell in accordance with the present invention, the diaphragm structure includes: a diaphragm structural body for detecting infrared radiation; a semiconductor substrate electrically connected to the diaphragm structural body; and supporting members, provided between the semiconductor substrate and the diaphragm structural body, for supporting the diaphragm structural body over the semiconductor substrate with a predetermined gap therebetween, wherein the metal wiring films are provided on the supporting members, and there is provided an insulating layer to cover the metal wiring films formed on at least the supporting members.

According to the arrangement, similar to embodiments 4, 5, and 7, the insulating layer covers the metal wiring films on the supporting members, and thus effectively protects the normally exposed metal wiring films on the supporting members. This imparts improved environmental insusceptibility to the thermal-type infrared radiation detector cell.

[Embodiment 10]

Figure 19:
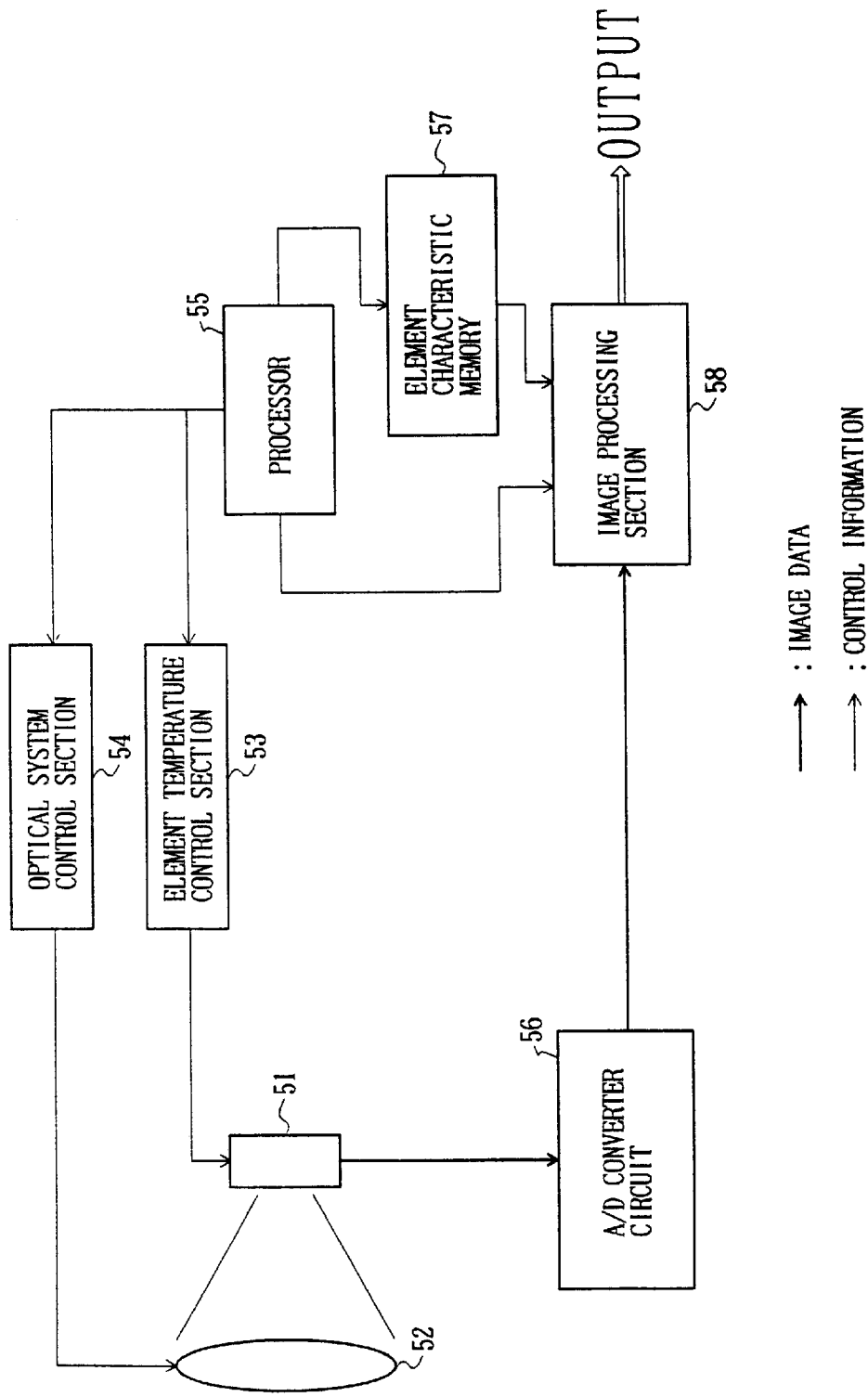
FIG. 19 is a block diagram showing an arrangement of an image capture device of an embodiment in accordance with the present invention.

Referring to FIG. 19, the following description will discuss an infrared ray image capture device as an embodiment of the present invention. The embodiment by no means constitutes a limitation on the scope of the present invention.

An infrared ray camera (image capture device) incorporates an infrared radiation image capture element prepared from thermal-type infrared radiation detector cells of embodiment 4 arranged in a matrix. Specifically, as shown in FIG. 19, an image capture device of the present embodiment is constituted primarily by an infrared radiation image capture element 51, an optical system 52, an element temperature control section 53, an optical system control section 54, a processor (control means) 55, an A/D converter circuit 56, an element characteristic memory (storage means) 57, and an image processing section 58.

The infrared radiation image capture element 51 includes, as mentioned above, thermal-type infrared radiation detector cells of embodiment 4 arranged, for example, in a 320×240 matrix. The optical system 52 is provided to focus incident infrared rays; this purpose is served using an optical system of a conventional, known arrangement. The element temperature control section 53 controls to keep the infrared radiation image capture element 51, i.e., the thermal-type infrared radiation detector cells constituting it, in a predetermined temperature range. The optical system control section 54 controls focusing and other operations of the optical system 52. The control sections are realized using conventional, known arrangement.

The processor 55 controls the element temperature control section 53, the optical system control section 54, the element properties memory (storage means) 57, and the image processing section 58, serving as control means of the image capture device of the present embodiment. Receiving infrared image data from the infrared radiation image capture element 51, the A/D converter circuit 56 converts it from analog to digital for output to the image processing section 58. The element properties memory 57 is storage means for storing data on various (element) properties of the infrared radiation image capture element 51 and provides the data to the image processing section 58 through control by the processor 55.

The image processing section 58, as being controlled by the processor 55, processes digital image data input from the A/D converter circuit 56 according to the element properties provided by the element properties memory 57, including conversion of the data into digital image data for output, and supplies the output to display means (not shown) as indicated by an arrow in FIG. 19.

In FIG. 19, the bold arrows denote input and output directions of (analog and digital) image data, and the thin arrows denote input and output directions of control information which in the present embodiment includes element properties stored in the element properties memory 57. The processor 55, the A/D converter circuit 56, the element characteristic memory (storage means) 57, and the image processing section 58 are realized using conventional, known arrangement, and contains no limited arrangement.

The thermal-type infrared radiation detector cell in accordance with the present invention, as mentioned earlier, can absorb infrared rays by controlling the thickness of the high refractive index film constituting the infrared radiation absorption layer, and is therefore distinguished from conventional structures in that it is not affected by the distance separating the diaphragm structural body from the substrate. Therefore, in the infrared radiation image capture element 51 of the present embodiment, pixels, which are arranged in a 320×240 matrix, exhibit infrared radiation absorption rates that are far more constant than an infrared radiation image capture element constituted by thermal-type infrared radiation detector cells of a conventional structure.

Consequently, the pixels in the infrared radiation image capture element exhibit reduced irregularity in their sensitivities, and the infrared ray camera (image capture device) of the present embodiment is capable of producing extremely high quality images compared to conventional image capture devices.

As detailed above, the use of thermal-type infrared radiation detector cells in accordance with the present invention enables infrared rays to be absorbed efficiently as a result of reflection and interference in the infrared radiation receiving section, thereby eliminating the need to provide an infrared radiation absorbing film. This improves sensitivity in detecting infrared rays, simplifies the arrangement, and saves the cost. The image capture device using thermal-type infrared radiation detector cells in accordance with the present invention is therefore capable of capturing images with high sensitivity and high quality without adding to manufacturing costs.

In the present embodiment, the thermal-type infrared radiation detector cell described in embodiment 4 is used; however, this is by no means intended to restrict the scope of the invention. Any thermal-type infrared radiation detector cell within the scope of the present invention may be used. Instead of the thermal-type infrared radiation detector cell described in embodiment 4, the thermal-type infrared radiation detector cell described in embodiments 1 through 3, and 5 through 8 may be of course used.

In other words, the image capture device in accordance with the present invention incorporates thermal-type infrared radiation detector cells, wherein each thermal-type infrared radiation detector cell includes a diaphragm structural body provided with at least: an infrared ray entry surface through which infrared rays enter; and an infrared radiation reflector surface by which infrared rays having entered the diaphragm structural body are reflected, the infrared radiation reflector surface being disposed beneath the infrared ray entry surface, and the infrared ray entry surface is separated from the infrared radiation reflector surface by a distance specified substantially equal to ¼n times the wavelengths of incident infrared rays, where n is the refractive index of the substance interposed between the infrared ray entry surface and the infrared radiation reflector surface.

According to the arrangement, the thermal-type infrared radiation detector cell is capable of efficiently absorbing infrared rays through reflection and interference inside the infrared radiation receiving section, and therefore does not require an infrared radiation absorbing film to be formed separately. This improves sensitivity in the detection of infrared rays and allows for reduction in cost by means of simplifying the structure. As a result, the image capture device in accordance with the present invention incorporating such thermal-type infrared radiation detector cells produces high quality images with high sensitivity and restrain cost increase in manufacture.

As detailed in the above, the image capture device in accordance with the present invention incorporates thermal-type infrared radiation detector cells described in any one of embodiments 1 through 9. According to the arrangement, the thermal-type infrared radiation detector cells are used as image capture elements; therefore, pixels constituted by infrared radiation image capture elements exhibit infrared radiation absorption rates that are far more constant than an image capture device including infrared radiation detector cells of a conventional structure. Consequently, the image capture device in accordance with the present invention is such that pixels exhibit reduced irregularity in their sensitivities, and produces much higher-quality images than conventional technologies.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A thermal-type infrared radiation detector cell, comprising a diaphragmatic structural body including:

a thermally variable resistor film changing resistance upon reception of infrared rays; and metal wiring films electrically connected to the thermally variable resistor film and also to a terminal section in a substrate on which there is provided an integrated circuit, wherein the metal wiring films are formed so as to constitute an infrared radiation reflector film for reflecting incident infrared rays so that the thermally variable resistor film can receive the reflected infrared rays, wherein the diaphragmatic structural body includes a high refractive index film which is primarily composed of silicon and which has a sheet resistance of 45 k$\Omega$ to 105 k$\Omega$, and the diaphragmatic structural body has no infrared ray adsorbing film on the high refractive index film.

2. The thermal-type infrared radiation detector cell as defined in claim 1, wherein the metal wiring films are provided on a substantial entirety of either a top surface or a bottom surface of the thermally variable resistor film.

3. The thermal-type infrared radiation detector cell as defined in claim 1, wherein the metal wiring films are composed of a material capable of reflecting 95% or more of incident infrared rays entering the infrared radiation receiving section.

4. The thermal-type infrared radiation detector cell as defined in claim 3, wherein the metal wiring films are primarily composed of titanium.

5. The thermal-type infrared radiation detector cell as defined in claim 3, wherein the metal wiring films are primarily composed of aluminum.

6. The thermal-type infrared radiation detector cell as defined in claim 1, wherein:

the diaphragm structural body has such a substantially planar shape to provide a two-dimensionally spreading infrared radiation receiving area where infrared rays are received; and the metal wiring films are formed so as to two-dimensionally spread substantially corresponding to the infrared radiation receiving area.

7. The thermal-type infrared radiation detector cell as defined in claim 1, further comprising an insulating layer provided between the thermally variable resistor film and the metal wiring films.

8. The thermal-type infrared radiation detector cell as defined in claim 7, wherein
the thermally variable resistor film is provided on either a top surface or bottom surfaces of the metal wiring films.

9. The thermal-type infrared radiation detector cell as defined in claim 7, wherein
the insulating layer is primarily composed of silicon oxide.

10. The thermal-type infrared radiation detector cell as defined in claim 1, wherein
the diaphragm structural body includes an infrared ray entry surface; and
the infrared ray entry surface is separated from surfaces of the metal wiring films by a distance substantially equal to ¼n times the wavelengths of incident infrared rays, where n is the refractive index of the sub stance interposed between the infrared ray entry surface and the surfaces of the metal wiring films.

11. A thermal-type infrared radiation detector cell, comprising:
a diaphragm structural body including a high refractive index film, wherein the diaphragm structural body further includes an infrared radiation reflector film provided beneath the high refractive index film, and the high refractive index film has a thickness, d, given approximately by $d=\lambda \times \{1/(4\times n)\}$, where n is a refractive index of the high refractive index film and $\lambda$ is the wavelengths of infrared rays absorbed,
wherein the is primarily composed of silicon and which has a sheet resistance of 45 k$\Omega$ to 105 k$\Omega$, and the diaphragmatic structural body has no infrared ray adsorbing film on the high refractive index film.

12. The thermal-type infrared radiation detector cell as defined in claim 11, wherein
the diaphragm structural body further includes:
a thermally variable resistor film changing its electric conductance with temperature variations; and metal wiring films electrically connected to the thermally variable resistor film.

13. The thermal-type infrared radiation detector cell as defined in claim 12, wherein
an insulating layer is interposed between the infrared radiation reflector film and the thermally variable resistor film.

14. The thermal-type infrared radiation detector cell as defined in claim 12, wherein the thermally variable resistor film is provided between the high refractive index film and the infrared radiation reflector film.

15. The thermal-type infrared radiation detector cell as defined in claim 12, wherein
the infrared radiation reflector film doubles as metal wiring films.

16. The thermal-type infrared radiation detector cell as defined in claim 12, wherein
there is provided an insulating layer between the high refractive index film and the infrared radiation reflector film.

17. The thermal-type infrared radiation detector cell as defined in claim 12, further comprising
a supporting member, provided between the semiconductor substrate and the diaphragm structural body electrically connected to each other, for supporting the diaphragm structural body over the semiconductor substrate with a predetermined gap therebetween,
wherein
the metal wiring films are provided on the supporting member, and there is provided an insulating layer to cover the metal wiring films formed on at least the supporting member.

18. The thermal-type infrared radiation detector cell as defined in claim 12, wherein
the high refractive index film doubles as the thermally variable resistor film.

19. A thermal-type infrared radiation detector cell, comprising:
a semiconductor substrate on which there is provided an integrated circuit; and
a substantially planar diaphragm structural body electrically connected to, and separated by a predetermined gap, from the semiconductor substrate, wherein the diaphragm structural body is provided with at least:
an infrared ray entry surface through which infrared rays enter;
an infrared radiation reflector surface by which infrared rays having entered the diaphragm structural body are reflected, the infrared radiation reflector surface being disposed beneath the infrared ray entry surface, and the infrared ray entry surface is separated from the infrared radiation reflector surface by a distance specified substantially equal to ¼n times the wavelengths of incident infrared rays, where n is a refractive index of a substance interposed between the infrared ray entry surface and the infrared radiation reflector surface; and
a high refractive index film which is primarily composed of silicon and which has a sheet resistance of 45 k$\Omega$ to 105 k$\Omega$, and the diaphragmatic structural body has no infrared ray adsorbing film on the high refractive index film.

20. The thermal-type infrared radiation detector cell as defined in claim 19, wherein
the infrared radiation reflector surface is formed to constitute either a surface of an infrared radiation reflector film or a surface of a metal wiring films in the diaphragm structural body.

21. The thermal-type infrared radiation detector cell as defined in claim 20, further comprising
a thermally variable resistor film provided either over or beneath the metal wiring films.

22. The thermal-type infrared radiation detector cell as defined in claim 21, further comprising
an insulating layer for providing protection to the thermally variable resistor film.

23. The thermal-type infrared radiation detector cell as defined in claim 20, further comprising
an insulating layer for insulating the metal wiring films.

24. An image capture device, comprising a thermal-type infrared radiation detector which has a diaphragmatic structural body including:
a thermally variable resistor film changing resistance thereof upon reception of infrared rays; and
metal wiring films electrically connected to the thermally variable resistor film and also to a terminal section in a substrate on which there is provided an integrated circuit, wherein the metal wiring films are formed so as to constitute an infrared radiation reflector film for reflecting incident infrared rays so that the thermally variable resistor film can receive the reflected infrared rays, wherein the diaphragmatic structural body includes a high refractive index film which is primarily composed of silicon and which has a sheet resistance of 45 kΩ to 105 kΩ, and the diaphragmatic structural body has no infrared ray adsorbing film on the high refractive index film.

25. An image capture device, comprising:

a thermal-type infrared radiation detector cell including a diaphragm structural body including a high refractive index film, wherein the diaphragm structural body further includes an infrared radiation reflector film provided beneath the high refractive index film, and the high refractive index film has a thickness, d, given approximately by $d=\lambda \times \{1/(4 \times n)\}$ where n is a refractive index of the high refractive index film and $\lambda$ is the wavelengths of infrared rays absorbed, wherein the the high refractive index film is primarily composed of silicon and which has a sheet resistance of 45 kΩ to 105 kΩ, and the diaphragmatic structural body has no infrared ray adsorbing film on the high refractive index film.

26. An image capture device, comprising a thermal-type infrared radiation detector cell including:

a semiconductor substrate on which there is provided an integrated circuit; and a substantially planar diaphragm structural body electrically connected to, and separated by a predetermined gap, from the semiconductor substrate, wherein the diaphragm structural body is provided with at least:

an infrared ray entry surface through which infrared rays enter;

an infrared radiation reflector surface by which infrared rays having entered the diaphragm structural body are reflected, the infrared radiation reflector surface being disposed beneath the infrared ray entry surface, and the infrared ray entry surface is separated from the infrared radiation reflector surface by a distance specified substantially equal to $\frac{1}{4}n$ times the wavelengths of incident infrared rays, where n is a refractive index of a substance interposed between the infrared ray entry surface and the infrared radiation reflector surface; and a high refractive index film which is primarily composed of silicon and which has a sheet resistance of 45 kΩ to 105 kΩ, and the diaphragmatic structural body has no infrared ray adsorbing film on the high refractive index film.

* * * * *